United States Patent [19]

Webb

[11] Patent Number: 5,159,486

[45] Date of Patent: Oct. 27, 1992

[54] INSTRUMENTATION APPARATUS AND METHODS UTILIZING PHOTOCONDUCTORS AS LIGHT-MODULATED DIELECTRICS

[75] Inventor: George W. Webb, Del Mar, Calif.

[73] Assignee: Innova Laboratories, Inc., San Diego, Calif.

[21] Appl. No.: 484,028

[22] Filed: Feb. 22, 1990

[51] Int. Cl.$^5$ ............................. G02F 1/29; G02F 1/03; G02F 1/07

[52] U.S. Cl. ................................. 359/299; 359/241; 359/244

[58] Field of Search .................. 359/299, 241, 244

[56] References Cited

U.S. PATENT DOCUMENTS

| | | | |
|---|---|---|---|
| 3,790,252 | 2/1974 | Pao | 359/299 |
| 4,190,811 | 2/1980 | Alcock et al. | 359/299 |
| 4,508,431 | 4/1985 | Henshaw | 359/299 |
| 4,541,017 | 9/1985 | Feight et al. | 358/295 |
| 4,812,756 | 3/1989 | Curtis et al. | 324/158 R |

OTHER PUBLICATIONS

Craig, et al. "Stress Dependence of Contact Potential: The AC Kelvin Method," *Rev. Sci. Instrum.*, vol. 41, No. 2, pp. 258–264 (Feb. 1970).

Besocke, et al., "Piezoelectric Driven Kelvin Probe for Contact Potential Difference Studies," *Rev. Sci. Instrum.*, vol. 47, No. 7, pp. 840–842 (Jul. 1976).

Wachtel, et al., "New Application of the Kelvin method involving the Scanning of the Bucking Voltage," *Rev. Sci. Instrum.*, Col. 51, No. 10, pp. 1421–1423 (Oct. 1980).

Baumgartner, et al., "Micro Kelvin Prove for Local Work-Function Measurements," *Rev. Sci. Instrum.*, vol. 59, No. 5, pp. 802–805 (May 1988).

*Primary Examiner*—Rolf Hille
*Assistant Examiner*—Robert Limanek
*Attorney, Agent, or Firm*—Fitch, Even, Tabin & Flannery

[57] ABSTRACT

A light-modulated photoconductor, exhibiting a variable permittivity, provides the basis for various instrumentation devices and methods. In one embodiment, the light-modulated photocondcutor is used as a dielectric between conductive plates to provide a light-modulated capacitor (photocapacitor). One of the conductive plates may be transparent to facilitate application of the modulating light to the photoconductor. The light-modulated capacitor may be used for numerous applications, such as instrumentation used to, e.g., measure the work function of surfaces during processing or as a non-contact voltmeter. In another embodiment, the light-modulated photoconductor is used as a mirror or lens wherein the index of refraction is optically modulated. Such light modulated lens or mirror assembly may be used as a beam steering device, e.g., a solid state infra-red (IR) beam steering device.

11 Claims, 3 Drawing Sheets

| RESONANCE (Hz) | LIGHT INTENSITY ($\mu W/cm^2$) |
|---|---|
| 7480 | DARK (<<1) |
| 7400 | 13 |
| 7320 | 25 |
| 7160 | 50 |
| 6360 | 110,000 |

INSTRUMENTATION APPARATUS AND METHODS UTILIZING PHOTOCONDUCTORS AS LIGHT-MODULATED DIELECTRICS

This invention is based on work supported by the National Science Foundation under Grant No. IS-8860687. The Government may have certain rights in this invention.

BACKGROUND OF THE INVENTION

The present invention relates to instrumentation apparatus and methods utilizing a light-modulated photoconductor as a dielectric, lens, mirror, or similar structure. Such light-modulated photoconductor exhibits a variable permittivity, which variable permittivity allows the light-modulated photoconductor to be used for many and varied applications. As a dielectric, for example, the light-modulated photoconductor may be used between conductive plates or surfaces to provide a light-modulated capacitor, or "photocapacitor". Such photocapacitor may be incorporated into instrumentation used to, e.g., measure the work function of surfaces during processing, or as a non-contact voltmeter. As a lens or mirror, the light-modulated photoconductor provides a means for optically modulating the index of refraction of a lens or mirror assembly. Such lens or mirror assembly may be incorporated into a beam steering device, e.g., a solid state infra-red (IR) beam steering device.

Many modern processes require precise surface properties. In order to prepare well characterized surfaces, a versatile instrument is needed that can probe surface properties during device processing under a variety of environmental conditions. One technique known in the art for determining surface properties is to measure the work function.

The work function of a material is defined as the energy that must be supplied to remove an electron at the Fermi level through the surface to a point in space outside the body far enough away that the image potential is negligible. There are two contributions to the work function of a material: the Fermi energy and the surface potential barrier.

Because the work function depends on the surface potential barrier, it is a sensitive measure of surface physical and chemical properties. For example, the work function varies with the actual crystal plane exposed at the surface by an amount typically of several tenths of an electron volt (eV) out of an overall typical magnitude of two to six eV. Work function variations due to the presence of adsorbed surface species or changes in composition at the surface are even larger. These surface chemical changes produce variations in work function of up to several eV. For these reasons, the work function is an extremely useful probe of surface properties.

Further, many applications require devices which are sensitive to the surface properties. These devices depend either directly or indirectly on the work function for their operation. All thermionic and photoemissive devices, for example, clearly depend on the work function for their operation. Further, the work function indirectly enters the operation of many integrated circuit devices which depend on current flow across internal junctions. In addition, superconducting quantum interference devices (SQUIDS) depend indirectly on the work function of the two materials comprising the device. Hence, the work function becomes an extremely useful parameter to measure and monitor.

There is also an ever increasing need to monitor the high $T_c$ superconductor surface electrical properties during processing of tunnel junction structures and high frequency cavity structures. Further, there is often a need to monitor surfaces of semiconductor devices during processing (in-situ wafer processing), not just before and after processing. In addition, there is a great need to monitor surfaces during surface cleaning operations. These and other specific needs emphasize the overall need for a monitoring device that does not contact the surfaces being monitored, so that, e.g., high temperatures, wafer processing, or surface cleaning operations may proceed relatively unimpeded.

In general, the instrumentation devices and methods known in the art for measuring the work function include: (1) photoemission; (2) thermionic emission; (3) field emission; and (4) contact potential difference (CPD). The first three of these techniques disadvantageously require a high vacuum for their operation. The CPD method can be carried out by either: (a) a diode technique, which requires a high vacuum, or (b) a variable capacitance technique. Because creating a high vacuum requires a significant amount of auxiliary equipment, which auxiliary equipment is usually expensive and burdensome to acquire, maintain, and operate, the variable capacitance CPD method is usually preferred.

In the variable capacitance method, the CPD is usually measured by the technique of Kelvin and Zisman, as described, e.g., in Holzl and F.K. Schulte, in *Solid Surface Physics*, edited by G. Hohler, Vol. 85 of "Springer Tracts in Modern Physics", pp. 1–150 (Springer, Berlin 1979). This method depends upon the fact that when two dissimilar materials are brought into electrical contact, a charge flows until the chemical potential of the conduction electrons are equal. The resulting electrostatic voltage between the two conductors, the CPD, is measured by varying the capacitance between them. This is explained more fully below in Appendix A.

Instrumentation apparatus employing the variable capacitance CPD method must provide a capacitor having a capacitance value that can be easily modulated at a desired frequency. Prior art techniques for modulating a capacitor have typically employed a vibrating capacitor wherein the capacitor plate spacing is mechanically varied. Unfortunately, mechanical factors limit the frequency of vibration of such capacitors to typically a few hundred Hz. In addition, with mechanical vibration at any frequency, stray capacitance to surrounding components produces a time varying signal that is indistinguishable from the signal of interest. Higher frequencies of modulation would lower the noise and provide a greater resolution of the measurement. Hence, what is needed to efficiently and accurately carry out the CPD method of measuring the work function is a capacitor that can be modulated at high frequencies, ideally by non-mechanical means.

Some existing instruments provide probes using piezoelectric elements to vary the plate spacing. See, e.g., Baumgartner et al., "Micro Kelvin Probe for Local Work-Function Measurements," *Rev. Sci. Instrum.* 59, 802 (1988); Besocke et al., "Piezoeletric Driven Kelvin Probe for Contact Potential Difference Studies," *Rev. Sci. Instrum.* 47, 840 (1976). In theory, such elements could oscillate at Mhz frequencies, but in practice are typically limited to frequencies just below 1 Khz. This is because at the higher frequencies the vibration amplitudes become very small and the driving voltages become very large (approaching a kilovolt). Such large driving voltages pose problems of interference with the CPD measurement. Moreover, as previously mentioned, any mechanical vibration, regardless of the frequency, tends to create spurious signals through stray capacitance to surrounding components.

Other existing commercial instruments that utilize a variable capacitor operate in the low audio range. These instruments use vibrating reed or tuning forks in sensor heads. The heads require careful shielding for millivolt sensitivity and are therefore bulky. What is needed for low level (millivolt sensitivity) measurements is a compact non-mechanical high frequency method for capacitance variation. However, all known methods of varying capacitance rely on mechanical methods, e.g., vibrating, rotating, pendulum, driven oscillating wire, etc. There are no non-mechanical methods of varying the capacitance known to applicant, except one, and that relies on a radioactive source to generate an ion current, and only provides resolution to about 1 volt. Thus, there is a clear need for a non-mechanical method of varying a capacitor.

It is noted that in U.S. Pat. No. 4,812,756 (Curtis et al.), a contactless technique for measuring the voltage changes between a top surface oxide layer and a bulk semiconductor wafer during processing is disclosed. However, the technique disclosed utilizes a conventional Kelvin probe apparatus employing a vibrating pick-up plate to vary the capacitance. For some measurements, Curtis et al. teach that the vibrating pick-up plate may be transparent in order to allow photons to be applied to the semiconductor wafer. Curtis et al. further emphasize the many and varied measurements that should be made on a semiconductor wafer in order to determine its suitability for further device processing. However, no teachings are provided by Curtis et al. relating to how the vibrating pick-up plate could be replaced with a non-vibrating plate, which is really what is needed if a non-mechanical variable capacitor structure is to be provided.

The present invention advantageously addresses the above and other needs by providing a capacitor structure wherein the capacitance value between a surface being monitored and a reference electrode may be varied by non-mechanical means.

SUMMARY OF THE INVENTION

The present invention is directed to apparatus and methods employing a light-modulated photoconductor. Advantageously, the light-modulated photoconductor exhibits a variable permittivity as a function of the applied light modulation. This variable permittivity allows the light-modulated photoconductor to be used for numerous applications.

In accordance with one aspect of the invention, for example, the light-modulated photoconductor is used as a dielectric between conductive plates, or equivalent conductive regions, thereby providing a light-modulated capacitor, or "photocapacitor". Such photocapacitor has numerous and varied uses. One use of the photocapacitor is as part of a non-mechanical, non-contacting variable capacitance probe. Such probe may, in turn, form part of instrumentation used to, e.g., conveniently measure the work function of surfaces during processing. In accordance with this aspect of the invention, instrumentation is thus realized that can readily perform the function of a non-mechanical Kelvin probe, a non-contacting voltmeter, or an electric field sensor. Being able to sense an electric field further leads to instrumentation that can be used as a non-contacting charge readout, e.g., a sensor that senses or reads an array of detectors of the type that develop a charge as a result of sensing radiation, such as an infrared (IR) detector.

In accordance with another aspect of the invention, the light-modulated photoconductor is used as a mirror or lens wherein the index of refraction is optically modulated. Such light modulated lens or mirror assembly finds use in numerous applications, such as a beam steering device, e.g., a solid state infra-red (IR) beam steering device.

Broadly, then, the present invention may be described as instrumentation apparatus that includes: (1) a photoconductor having a band gap frequency, the photoconductor exhibiting a first permittivity when not exposed to light or when exposed to light of frequencies less than the band gap frequency, and a permittivity other than the first permittivity when exposed to light of frequencies greater than the band gap frequency; (2) light exposing means for selectively exposing the photoconductor to light having frequencies greater than the band gap frequency, whereby the photoconductor exhibits a permittivity other than the first permittivity when so exposed; and (3) means for incorporating the photoconductor within the instrumentation apparatus so that a first desired effect is created when the photoconductor exhibits the first permittivity, and an effect other than the first desired effect is created when the photoconductor exhibits a permittivity other than the first permittivity. When used as a photocapacitor, the desired effects are differing values of capacitance which may be used, e.g., in a non-mechanical Kelvin probe to measure the work function. When used as a lens or mirror, the desired effects are differing values of the index of refraction of the photoconductor, which differing values allow a beam of electromagnetic radiation, such as an IR beam, to be controllably steered.

Further, the invention contemplates a non-mechanical method of measuring the contact potential difference (CPD) existing between a conductive material and a reference electrode. The method comprises: (a) placing a photoconductor between the conductive material and the reference electrode so that the photoconductor, conductive material and reference electrode are electrically insulated from each other, the photoconductor, conductive material and reference electrode comprising a photo-capacitor; (b) inserting a dc bucking voltage in series circuit relationship with said photocapacitor; (c) optically varying the photocapacitor at a first frequency, thereby causing an alternating current of this first frequency to flow in the series circuit relationship; (d) monitoring the amplitude of the ac current; and (e) adjusting the magnitude of the dc bucking voltage until the amplitude of the ac current is substantially zero, whereupon the CPD is equal to the value of the dc bucking voltage. As described above, the photocapacitor used with this method includes a photoconductor as a dielectric, and has plates that include the surface of the conductive material and the reference electrode. The photoconductor further has a band gap frequency, and the photoconductor exhibits a first permittivity when not exposed to light or when exposed to light of frequencies less than the band gap frequency, and a permittivity other than the first permittivity when exposed to light of frequencies greater than the band gap frequency. Thus, the photocapacitor is optically varied by simply selectively exposing or modulating the photoconductor with light having a frequency greater than the band gap frequency.

Advantageously, using this method, the photoconductor that forms the dielectric of the photocapacitor need not contact the conductive material whose work function is being measured. Hence, the method not only provides a non-mechanical CPD method (there being no moving mechanical elements as are required using prior art methods that perform the same function), but also provides a non-contact CPD method, thereby greatly simplifying the manner in which the method is carried out.

It is a feature of the present invention to provide simple-to-construct and easy-to-use instrumentation apparatus and methods utilizing light modulated photoconductors, such photoconductors exhibiting a variable permittivity or dielectric constant that varies as a function of modulated light directed to the photoconductor.

It is a further feature of the present invention to provide a non-mechanical light modulated capacitor (photocapacitor) that can be readily incorporated into instrumentation apparatus and methods used to, e.g., measure the work function of a material, as a non-contact voltmeter or read an IR detector array. It is another feature of the invention to provide such a photocapacitor that can be modulated at high frequencies without creating excessive electrical noise.

It is yet another feature of the present invention to provide an optically modulated photoconductor that serves as a non-mechanical lens or mirror used to selectively steer or guide a beam of electromagnetic radiation passing through, or reflecting from, such photoconductor.

BRIEF DESCRIPTION OF THE DRAWINGS

The above and other aspects, advantages and features of the present invention will be more apparent from the following more particular description thereof, presented in conjunction with the following drawings and Appendices, wherein.

Figure 3:
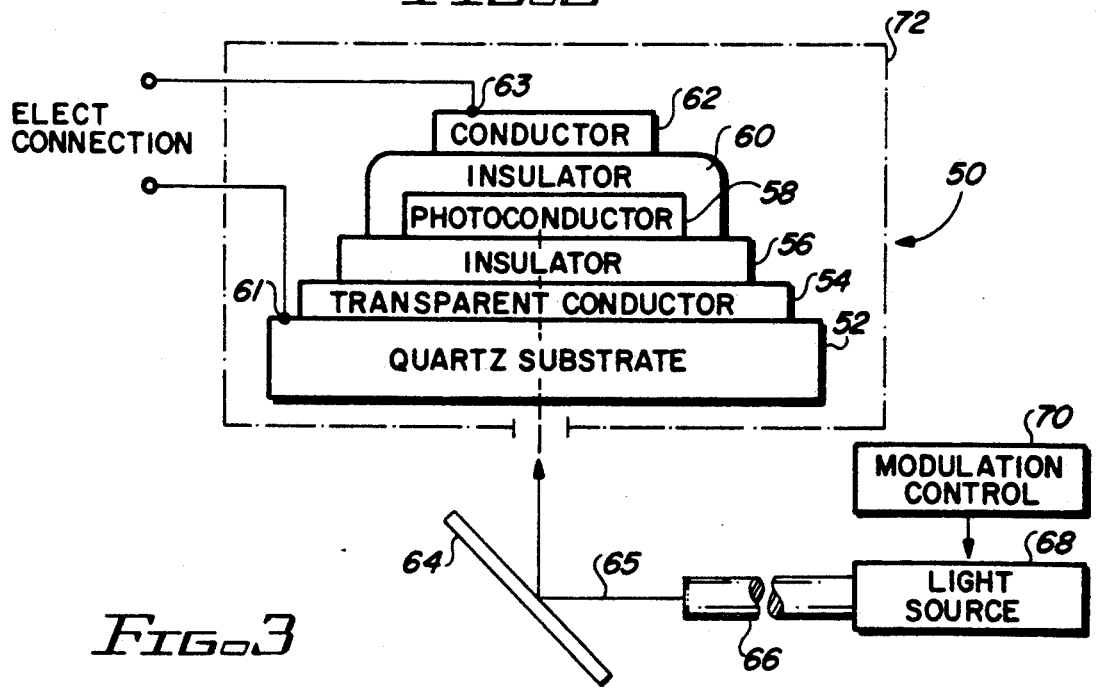
FIG. 3 is a layered structure diagram of one embodiment of a photocapacitor made in accordance with the present invention.

Appendix A describes the work function, and shows how the work function may be measured by modulating a capacitor; and Appendix B provides some test data and signal waveforms obtained from testing the circuit of FIG. 3

DETAILED DESCRIPTION OF THE INVENTION

The following description is of the best mode presently contemplated of practicing the invention. This description is not to be taken in a limiting sense, but is made merely for the purpose of describing the general principles of the invention. The scope of the invention should be ascertained with reference to the claims.

The present invention relates to instrumentation apparatus and methods utilizing the variable permittivity provided by a light-modulated photoconductor. Before describing the invention, it will be helpful to review some basic principles relating to photoconductors and capacitors.

A photoconductor is usually described as a material that exhibits a resistance, or conductivity, that varies in the presence of visible light, infrared, or ultraviolet radiation. Materials that exhibit such variable conductivity are thus appropriately called photoconductive materials. The property of changing resistance in accordance with impinging light intensity is called photoconductivity. Every photoconductive material has a band gap frequency associated therewith. Light, or other electromagnetic radiation, having a frequency greater than the band gap frequency causes the conductivity of the photoconductive material to increase when it impinges on the photoconductor.

In general, a photoconductive substance has a certain finite resistance when there is no visible light (or other electromagnetic radiation having a frequency greater than the band gap frequency) falling on it. As the intensity of the visible light increases, the resistance decreases (i.e., the material becomes more conductive). There is a limit, however, to the extent that the resistance continues to decrease as the intensity of the impinging light increases.

Photoconductivity occurs in almost all materials to a certain extent. However, it is much more pronounced in semiconductors. When light energy strikes a photoconductive material, the density of charge-carriers increases. Thus, current can be more easily made to flow when a voltage is applied. The more photons are absorbed by the material for a given electromagnetic wavelength, the more easily the material conducts an electric current.

Some examples of photoconductive substances are germanium, silicon, and the sulfides of various other elements. For purposes of the present invention, a preferred photoconductive material is cadmium sulfide.

A capacitor is a device designed for providing a known capacitance in an electrical circuit. Capacitance is the ability of a device to store an electric charge. The electric charge is stored on conductive plates that are electrically insulated and spaced apart from each other. The capacitance greatly increases when a dielectric (insulator) is inserted between the plates. The ratio of capacitance absent a dielectric between the plates to the capacitance with a specific dielectric between the plates is known as the dielectric constant, $\kappa$, of that specific dielectric.

Different materials exhibit different dielectric constants, and in the design of capacitors, the particular dielectric material used is carefully selected to provide a desired capacitance. The permittivity, $\epsilon$, of a dielectric or other material is proportional to the dielectric constant. More precisely, $\epsilon = \epsilon_o \kappa$, where $\epsilon_o$ is the permittivity of free space (a physical constant $\approx 8.85 \times 10^{-12}$ coul$^2$/n·m$^2$). The parameter $\kappa$ is also known as the relative permittivity, $\epsilon/\epsilon_o$. Sometimes the terms "dielectric constant" and "permittivity" of a given material are loosely treated as synonyms.

The capacitance of a given capacitor may be expressed as $$C = A\epsilon/d \qquad (1)$$

where A is the area of the plates of the capacitor, and d is the plate spacing.

In accordance with one aspect of the present invention, it has been discovered that a photoconductor may be used as a dielectric in a capacitor. When not exposed to light, the photoconductor exhibits a high resistance, and is thus a good insulator. Hence, a "dark" photoconductor (one not exposed to light) exhibits a permittivity or dielectric constant that allows it to be effectively used between the plates of a capacitor to increase the capacitance of the capacitor, much as any dielectric may be used. However, when the photoconductor is exposed to visible light, infrared, or ultraviolet (or other electromagnetic radiation having a frequency greater than the band gap frequency), the photoconductor becomes more conductive, causing its permittivity to significantly change. This change in permittivity, in turn, causes the capacitance to change. It is this ability to change the permittivity of a capacitor by exposure to light that has led to the development of the light-modulated capacitor, or photocapacitor, described herein.

Figure 1:
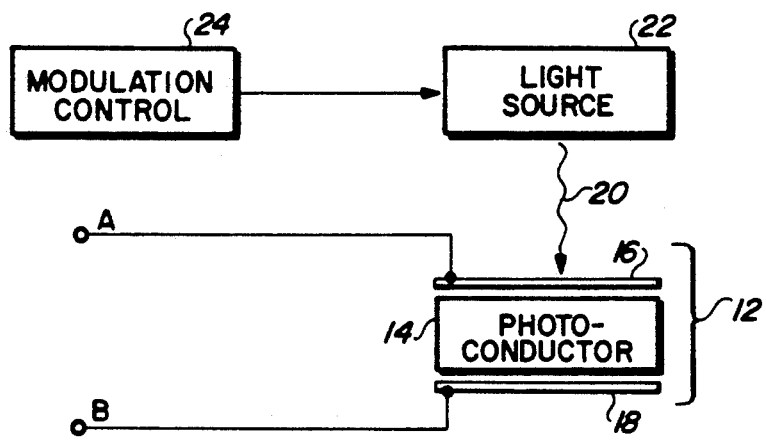
FIG. 1 is a schematic diagram of a photocapacitor made using an optically modulated photoconductor as a dielectric.

Referring to FIG. 1, a diagram of a photocapacitor 12 made in accordance with the teachings of the present invention is schematically depicted. The photocapacitor 12 includes a photoconductor 14 that is placed in between a first conductive plate or region 16 and a second conductive plate or region 18. The capacitance of the photocapacitor 12 is measured between the plates 16 and 18, e.g., at terminals A and B. The photoconductor 12, in the absence of light, or in the presence of light less than the band gap of the photoconductor, exhibits a dielectric constant that allows the photocapacitor to assume a first capacitance value. A light source 22 provides light, represented schematically by the wavy arrow 20, that is directed at the photoconductor 14. Such light has a frequency greater than the band gap of the photoconductor 14. As shown in FIG. 1, a preferred beam path for the light 20 is through the plate 16, meaning that such plate 16 must be transparent to the light 20. The light source 22 is controlled by a suitable modulation control circuit 24. Alternatively, the light from the source can be modulated by some other means, such as a mechanical chopper, etc.

Thus, in operation, the light source 22 generates the light 20 in accordance with a prescribed modulation pattern dictated by the modulation control circuit 24. Such modulation pattern may be as simple as an alternating ON-OFF pattern, wherein the light 20 alternates between ON and OFF states; or a more complex modulation pattern, wherein the light 20 is ON or OFF in accordance with the bit pattern of a multibit digital word. Regardless of the modulation pattern, when the light 20 is ON, the photoconductor 14 becomes more conductive, causing the dielectric constant or permittivity of the photoconductor to change. This change, in turn, causes the capacitance of the photocapacitor 12 to decrease. Similarly, when the light 20 is OFF, the photoconductor 14 becomes less conductive, causing the dielectric constant or permittivity to change in the opposite direction. In turn, this change causes the capacitance of the photocapacitor 12 to increase.

While many embodiments and applications of a photocapacitor as described herein will utilize an ON-OFF modulation, thereby effectively causing the capacitance of the photocapacitor to alternate between two values, it is to be emphasized that the invention is not limited to ON-OFF modulation of the controlling light 20. Analog modulation of the photoconductor may also be employed, e.g., changing the intensity of the light 20 so as to force the photocapacitor 12 to assume a desired value. In this way, a light modulated capacitor is realized wherein the capacitance value of such capacitor may be tuned to a desired value by controlling the amount of light 20 that illuminates or impinges upon the photoconductor 14.

It is further noted in FIG. 1 that the photoconductor 14 need not be physically coupled to the conductive plates 16 and 18 of the photocapacitor 12. As a practical matter, however, as explained below in connection with FIG. 2, it will normally be physically coupled to one of these plates, e.g., the transparent plate 16, thereby assuring good optical alignment of the photoconductor 14 with the light source 22. The other conductive plate or region 18 may then be detached from the photoconductor 18, with a small gap therebetween. Such a gap advantageously allows, e.g., the surface properties of the region 18 to be monitored without having to make physical contact therewith.

Figure 2:
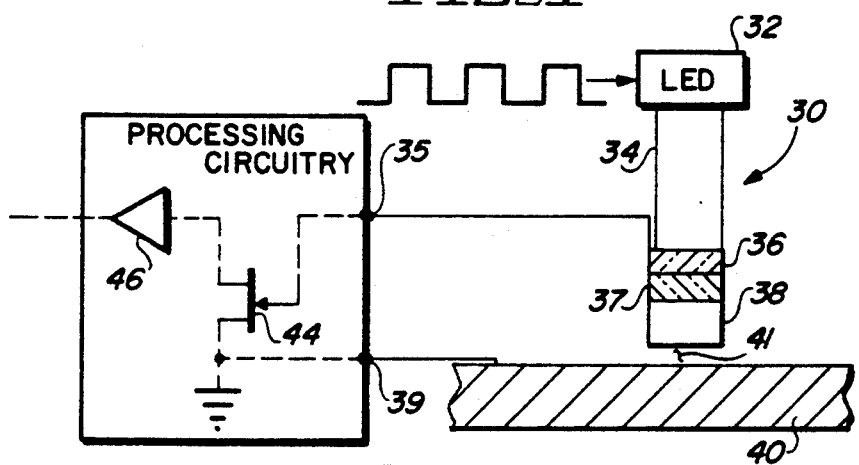
FIG. 2 is a schematic diagram of a non-mechanical non-contacting variable capacitance probe.

FIG. 2 is a schematic diagram of a non-mechanical non-contacting variable capacitance probe 30 that utilizes a photocapacitor similar to that shown in FIG. 1. A light source 32 is coupled to a remote end of a fiber optic element 34. The light source may be, e.g., a light emitting diode (LED) that is controlled by an electrical current. The electrical current may be generated using conventional means. The larger the electrical current, the more intense the light generated by the LED. Hence, a pulsed modulation of the LED produces a pulsed light, or an ON-OFF modulated light.

At the probe end of the fiber optic cable 34 is a transparent reference electrode 36. This reference electrode 36 is electrically coupled to a first terminal 35 of a processing circuit 42. A transparent insulating layer 37 physically and optically connects the transparent reference electrode 36 to a photoconductor 38. Spaced apart from the photoconductor 38 by a gap 41 is a substrate 40. The substrate 40 is typically a semiconductor, or other conductive material, having a conductive surface whose properties are to be monitored or measured. The surface of the substrate 40 is electrically connected to a second terminal 39 of the processing circuit 42.

In operation, the modulated light beam travels down the fiber optic cable or element 34, passes through the transparent conductor reference electrode 36, through the transparent insulator 37, and is absorbed in the photoconductor 38.

The reference electrode 36 and substrate 40 comprise a planar capacitor containing several dielectric layers, in this case three: the gap 41, the photoconductor 38, and the insulator 37. The capacitance of such a stack, assuming each has an area A, may be expressed as:

$$C = A\epsilon_0/[d_1/\kappa_1 + d_2/\kappa_2 + d_3/\kappa_3] \quad (2)$$

where $d_i$ and $\kappa_i$ are the thickness and relative dielectric constants of the layers making up the structure. While there are several ways of expressing the consequence of one of the layers (the photoconductor layer) being converted from a dielectric to a conductor, the simplest is that a conducting layer provides complete screening of field from its interior through its larger polarization charge, which can be expressed as an infinite dielectric constant. In such a case, and under sufficient illumination of light above the photoconductor's band gap, Equation (2) becomes $$C = A\epsilon_0/[d_1/\kappa_1 + d_3/\kappa_3] \quad (3)$$

where it is assumed that the photoconductor is layer 2. That is, it is $\kappa_2$ that is light modulated in order to produce a variable capacitance.

The processing circuitry 42 provides the necessary electronics for using the probe 30 as part of a desired instrumentation apparatus, e.g., to measure the work function of the substrate 40. The work function, and a manner of measuring it, using a variable capacitor, are described in Appendix A, submitted herewith, and incorporated herein by reference. The Contact Potential Difference (CPD) method of work function measurement is the preferred method. Using such method, it is necessary to connect the photocapacitor in series circuit relationship with a dc bucking voltage. The CPD also appears in the series circuit. By varying the photocapacitor, which can be conveniently and non-mechanically accomplished by modulating the light source 32, an ac current is caused to flow in the series circuit. The dc bucking voltage is then adjusted until the amplitude of the ac current is substantially zero. At this null point, the dc bucking voltage is substantially equal and opposite to the CPD. Thus, when the probe 30 is used to measure the CPD, the processing circuitry 42 includes appropriate circuitry for supplying an adjustable bucking voltage and measuring the ac current flowing in the series circuit.

Advantageously, there are numerous applications with which a light modulated capacitance or photocapacitor, such as the one included within the probe 30 of FIG. 2, may be used. For example, such probe may be used as a non-mechanical Kelvin probe. A Kelvin Probe measures the electric field generated by a charge transfer. The electric field is sensed by the change in polarization charge during modulation of the dielectric constant of the photoconductor by light. In essence, the modulated capacitor probe 30 is an electric field sensor. Accordingly, it can be used as a non-contacting voltmeter or electric field sensor to measure any ac or dc electric field. Steady, dc electric fields are found in several laboratory and meteorological research applications. Time varying or ac electric fields are found in plasma device characterization and radio frequency (rf) cavities. Advantageously, the present probe also has application as a non-intrusive probe for internal fields in rf cavities.

One application of the present invention is the characterization of surfaces during processing of high $T_c$ copper oxide based superconducting materials. These materials tend to lose oxygen from their surface. The oxygen is important for their superconducting properties, and for the important applications which depend on the superconducting properties of surfaces. A capacitive probe such as is described in FIG. 2 can advantageously be used to monitor and characterize such surfaces.

Further, a photocapacitor as herein described may be used to determine surface roughness or similar applications in the areas of machine tools and flying head technology. A capacitor with wide plate spacing is not sensitive to small variations in surface roughness, sensing only the mean plate separation. On the other hand, a capacitor with very close plate spacing has its capacitance increased significantly by the presence of bumps on the plate surface. Because the photocapacitor of the present invention appears as a capacitor where one plate is alternately close to and far from the other plate, such photocapacitor may be advantageously used to investigate surface roughness.

Similarly, one or more photocapacitors, such as are included in the probe 30 described in FIG. 2, or as is described in FIG. 1, may be used in instrumentation adapted to sense or read a detector of the type that develops a charge as a result of sensing radiation. A common detector of this type is an infrared detector. A common problem associated with such detectors is being able to read the charge developed in a non-intrusive manner without disturbing or altering the charge. Some detectors, for example, develop charge by virtue of their temperature being increased due to absorbed radiation. In such cases, it is important to minimize thermal contact to the sensing element. Hence, a non-contact sensor, such as the probe 30, is ideally suited for these applications. As needed, a non-contact array of fiber optic capacitive sensors, each sensor being substantially the same as the probe 30 in FIG. 2, may be used with an IR detector array. The presence of charge would be detected by the monitoring the ac voltage during illumination by a chopped light source. Advantageously, using such a non-contact array of photocapacitive fiber optic probes, the minimum number of necessary electrical connections to the IR detector array may be as low as one.

Alternatively, in the reverse sense, a photocapacitor with dc bias gives a response when illuminated by a light pulse, thereby providing a capacitive sensor of light for opto-electronic applications.

Other applications for a light-modulated capacitance include, but are not limited to: optical computing; fiber optic links; xerography; electrets; electrostatic discharge; charge decay; manufacturing of plastics, paper, and/or photographic film; and dielectric film thickness monitoring. Indeed, the possible uses and applications of a photocapacitor as described herein are numerous and varied.

Referring next to FIG. 3, a layered structure diagram of one embodiment of a photocapacitor 50 made in accordance with the present invention is illustrated. The embodiment of FIG. 3 has particular application to testing the feasibility of a photocapacitor as described above in FIG. 1, and as implemented within a probe as shown in FIG. 2, and for characterizing the performance of such a photocapacitor.

The manner in which the photocapacitor 50 of FIG. 3 is fabricated will now be described. A quartz substrate 52 serves as the structure upon which the photocapacitor is fabricated. A transparent conductive layer 54 is deposited on the quartz substrate. The conductive layer 54 is realized using indium tin oxide (ITO) having a thickness of approximately 2500 Å. A preferred manner of application of the conductive layer 54 is evaporating In$_{0.8}$Sn$_{0.2}$ onto the substrate and firing in air to convert to ITO. The thickness of the conductive layer 54, as well as the thicknesses of the other layers, may be measured using a surface profilometer, or equivalent.

Once the conductive layer 54 is applied to the substrate 52, an insulating layer 56 is added. This insulating layer 56 is realized form SiO, obtained by evaporating SiO through a mask that covers the conductive ITO layer 54 except for exposed pads. The SiO is then fired to convert it to SiO$_2$ having a thickness of about 4200 Å. As required, a variety of different treatments of sputtered and evaporated films may be combined in order to produce robust insulators with high resistivity. For the embodiment shown in FIG. 3, the final SiO$_2$ films have a resistance of about 5 MΩ measured through an area of 0.3 cm$^2$.

A photoconductive layer 58 is next applied on top of the insulating layer 56. Cadmium sulfide (CdS) is used as the photoconductor. The CdS may be co-evaporated through a mask onto 200° C. substrate followed by treatment at 500° C. over a bed of CdS containing Cu and CdCl. The thickness of the CdS photoconductive layer is preferably on the order of 5500 Å or greater. The dark resistance of the CdS layer 58 should be greater than 3 GΩ and its resistance should be less than 5 M$\neq$ in intense light.

The CdS layer 58 is then covered by another insulating layer 60. This layer is made from SiO$_x$, either sputtered in the presence of O$_2$ or evaporated in the presence of O$_2$. Evaporation at 1 Å/sec in a pressure of 2 × 10$^{-4}$ torr gives the best results.

Finally, a conductive layer 62 is applied over the insulating layer 60. This conductive layer 62 may be made from Au, evaporated through a mask to a thickness of 2500 Å. This top Au layer thus represents the sample surface. Ag layers may also be used for the conductive layer 62, but Au is preferred.

In order to make electrical connection with the conductive layers 54 and 62, leads may be attached to these layers using any suitable technique. For example, small 1 mm pure indium "bumps", represented in FIG. 3 as dots 61 and 63, may be placed on these surfaces. A freshly cut indium surface is then cold welded to the conductive surfaces 54 and 62 by pushing against the surface so that it deforms 10-20%, exposing fresh surface. Small wires (e.g. 50 micron Au) may then be cold welded to the indium bumps 61 and 63 to complete the electrical connection.

With a photocapacitor 50 (FIG. 3) made as above described, such capacitor was tested for resistance and capacitance using a layout as also illustrated in FIG. 3. A light source 68, controlled by a suitable modulation control circuit 70, generated a modulated light beam 65 of sufficient intensity and frequency to exceed the band gap of the photoconductor. The light beam was directed to the photoconductor 58 through a fiber optic cable 66, a mirror 64, the quartz substrate 52, the transparent conductive layer 54, and the insulator 56.

Using the layout shown in FIG. 3, and enclosing the entire photocapacitor within a grounded shielded enclosure (schematically represented by the dashed-dotted line 72), resistance and capacitance measurements were made as a function of light intensity. The dc resistance measurements were made though the thin dimensions of the film structure using an HP 3457A meter having a limit of 3 GΩ. Capacitance was also measured across the structure with the same configuration of leads. A circuitmate CM20A capacitance meter was used; which device employs an exponential decay method for capacitance measurement. The enclosure 72 was needed in order to shield the structures from ambient light.

Table 1 shows the measured capacitance and resistance results of the photocapacitor 50 (FIG. 3) at different light intensities.

TABLE 1

| Resistance (MΩ) | Capacitance (cap. meter) (nF) | Capacitance Modulation (%) | Light Intensity (μW/cm$^2$) |
|---|---|---|---|
| 1030 | 3.12 | 0 | dark (<<1) |
| 395 | 3.53 | 13 | 13 |
| 241 | 3.74 | 20 | 25 |
| 114 | 3.96 | 27 | 50 |
| 8 | 4.92 | 58 | 110,000 |

Any conventional light source may be used with the photocapacitor. For the measurements shown in Table 1, the light source 68 was realized for most measurements using a 150 W quartz halogen light source. However, because of attenuation in the fiber optic cable 66, and in various other elements in the configuration, the power to the sample was greatly reduced. For the highest intensity measurements, the film structure enclosure was opened and exposed to 300 W quartz halogen bulb from a distance of about 18 inches, giving an intensity about the same as bright sunlight.

The light intensity was measured using conventional techniques and instrumentation.

As indicated in Table 1, a strong modulation of capacitance is advantageously achieved using the photocapacitor layered structure shown in FIG. 3. Even at low light intensities, a useful capacitive modulation is obtained.

Figure 4:
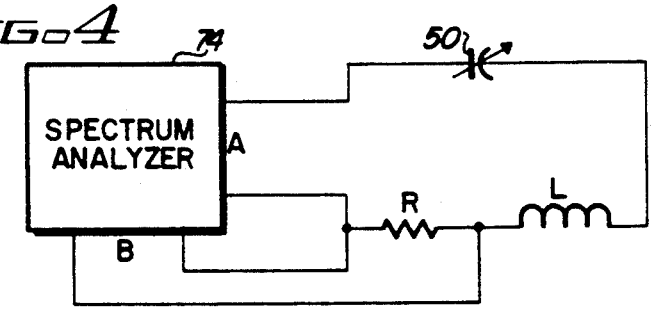
FIG. 4 is a series resonant circuit containing a photocapacitor, which circuit may be used, intra alia, to test and/or characterize the photocapacitor of FIG. 3.

To further verify the performance of the photocapacitor 50, its capacitance was also measured using a series resonant circuit with an inductor and small resistor as shown in FIG. 4. The circuit shown in FIG. 4 was driven by the A channel of a Spectrum Analyzer 74. (An HP 3582 Spectrum Analyzer was used.) The A channel of the analyzer 74 provides a voltage output signal from a noise generator. The circuit response, i.e., the transfer function of the circuit, was measured as a function of frequency by a detector and applied to the B channel. The results of the measurement at different light intensities are shown in FIG. 5.

Figure 5:
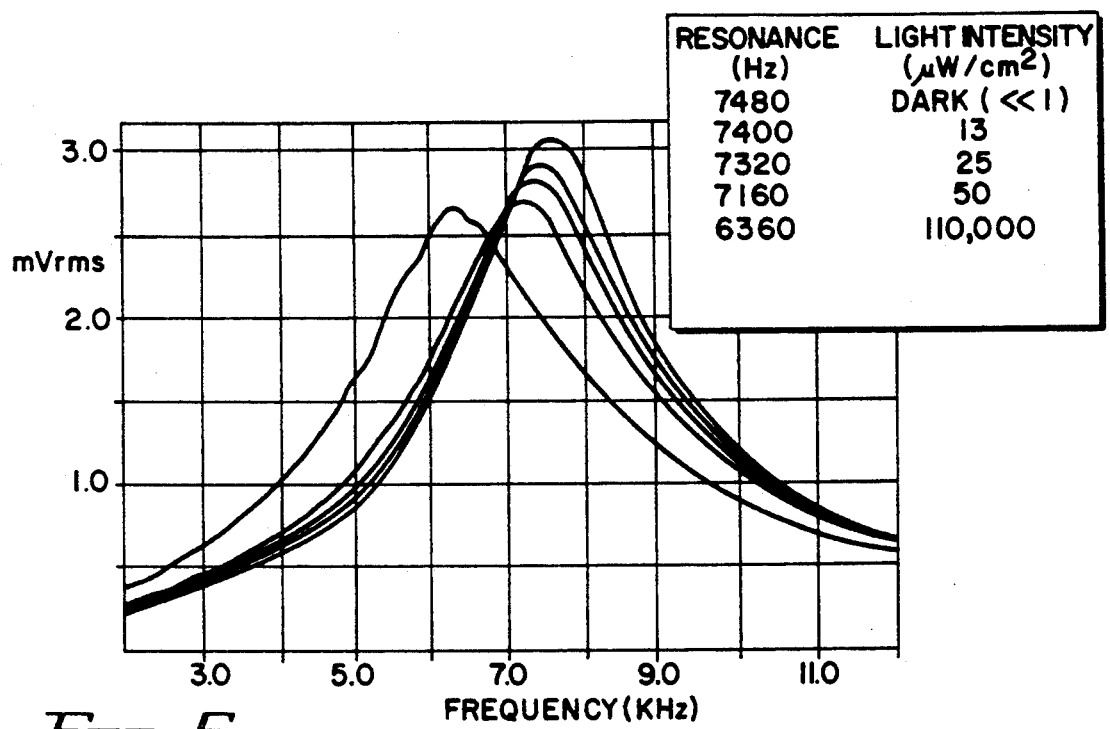
FIG. 5 shows a graph illustrating the frequency response of the spectrum analyzer of FIG. 4 for different light intensities.

As indicated in FIG. 5, it is seen that the peak response voltage across the resistance R (a 5Ω resistor) was 3 mV rms. The frequency of the peak in the transfer function was taken to be the resonant frequency. The inductor L was 0.143 H.

As seen in FIG. 5, as the light intensity increases, the resonance shifts to a lower frequency, as would be expected for a larger capacitance.

With the inductance known, the value of the photocapacitance 50 is calculated by assuming inductive reactance is equal and opposite at the peak in the transfer function. The results of such calculations for the data shown in FIG. 5 are summarized in Table 2, with the results of Table 1 being included for comparison. As seen in Table 2, relatively good correlation exists between the two methods of measuring.

TABLE 2

| Resistance (MΩ) | Capacitance (resonance method) (nF) | Capacitance (decay method) (nF) | Light Intensity (μW/cm²) |
|---|---|---|---|
| 1030 | 3.16 | 3.12 | dark (<<1) |
| 395 | 3.225 | 3.53 | 13 |
| 241 | 3.30 | 3.74 | 25 |
| 114 | 3.45 | 3.96 | 50 |
| 8 | 4.37 | 4.92 | 110,000 |

Figure 6:
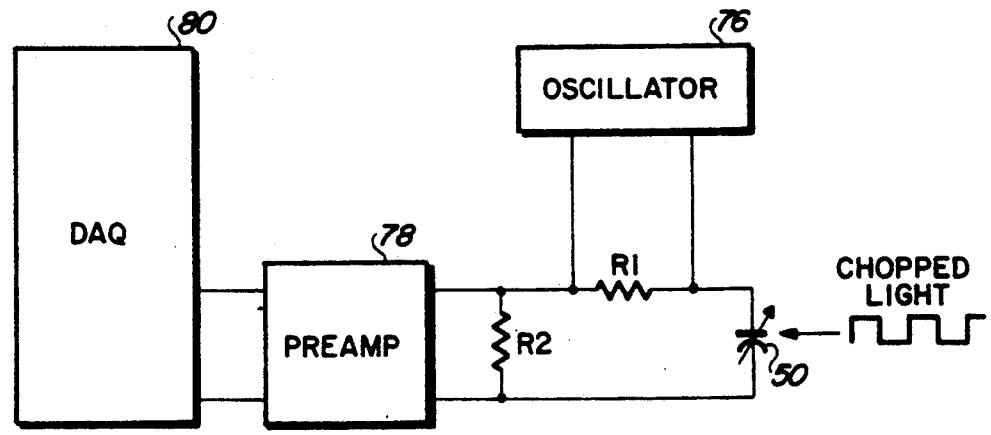
FIG. 6 depicts a circuit for CPD measurement using a light modulated capacitor.

Referring next to FIG. 6, a circuit is illustrated showing the manner in which a CPD measurement of a conductive surface is made using a light modulated capacitor, where one of the plates of the capacitor is the surface on which the CPD measurement is to be made. The circuit includes a light modulated photocapacitor, such as the photocapaitor 50 of FIG. 3, including a light source 68 and means for modulating the light source 70. The light from the light source is chopped at an appropriate chopping frequency, e.g. from about 40 Hz to 4 Khz. This causes an ac current to flow in the series circuit as previously described. This ac current is sensed with a preamplifier 78 that monitors the voltage developed across a resistor R2 as the ac current flows therethrough. The ac current thus measured is sampled and digitized at a 10-20 KHz rate using a data acquisition board (DAQ) 80 installed in a personal computer. Such DAQ 80 may be realized with a commercially available DAQ, such as the Metrabyte DAS-16G1. A bucking voltage is supplied by a low frequency oscillator 76, applied across a resistance R1. The bucking voltage is also applied to a channel of the DAQ 80. As the bucking voltage is swept through a value equal and opposite to the CPD, the ac voltage (representing the ac current) goes through a minimum. Representative test results obtained using the circuit of FIG. 6 to measure the CPD of an Au test surface, e.g., the surface 62 at the interface with insulator 60 of the photocapacitor 50, are included in Appendix B, submitted herewith, and incorporated herein by reference.

In addition to the materials and components described above for the photocapacitor of FIG. 3, the following additional materials, components, and comments are applicable to the design and fabrication of instrumentation apparatus using such a photocapacitor. In the sensor sub-system, i.e., the photocapacitor, there is great freedom of choice of sensor substrate material. The substrate needs only to be transparent, preferably in the shape of a cylinder to allow joining to the fiber optic with a good optical coupling, and compatible with conventional fabrication steps. Otherwise the substrate material can be chosen for ease of construction and other criteria. Alternate materials that may be used for the photoconductor include PbS, PbSe, CdSe, CdTe, HgCdTe, Ge, Si, GaAs, InP, ZnS, ZnSe and others. Alternative transparent reference electrodes include thin metal films, particularly noble metals, of thickness on the order to 100 Å. Alternative insulators include various oxides and $Si_3N_4$.

In the optics sub-system, including the light source 22, 32 or 68, the modulation control circuit 24 or 70, and the fiber optics 34 or 66, it is noted that a fiber optic guide is not absolutely required for operation, but is preferred as it easily confines the light to a desired path. The choice of the fiber optics is relatively unconstrained. It is important only that the transmissivity for light of wavelength above the photoconductor band gap be adequate. The light source is preferably mounted remote from the sensor on the other end of the fiber optic. It must produce adequate intensity of short wavelength light. The modulation circuit may be electrical or mechanical (e.g., rotating shutter), and must be able to modulate the light intensity at a high frequency. Most photoconductors of interest have cutoff wavelengths on the order of 0.5 to 5 microns, with the cutoff wavelength of CdS being 0.51 microns. In general, for purposes of the present invention, it is preferred that the upper end of the range be used in order to minimize thermally generated carriers and dark conductivity.

It is noted that the light generated by the light source need not be monochromatic. However, some vacuum gap positioning techniques are interferometric and will thus require monochromatic light. If required, low power laser sources, such as laser diodes, solid states lasers (e.g., YAG, etc.), Ar ion, and gas lasers (e.g., He-Ne) may be used. The light source may be conveniently located outside of the specimen enclosure (where the surface being monitored is located), and the fiber optic cable would pass through a feed through in order to be coupled to the sensor near the specimen surface.

In using a probe 30, such as the one illustrated in FIG. 2, it will generally be necessary to utilize a positioner assembly for holding and manipulating the sensor over the specimen surface. Such a holder preferably includes both coarse and fine positioning. The coarse positioning is used to move the sensor out of the way during some surface operations. The fine positioning is used to accurately set the gap spacing to a desired spacing for proper work function measurements. Fine control at the micron level may be accomplished by a piezoelectric or electromagnetic mechanism, or by a fine micrometer screw.

The measurement of the distance between the sensor and the unknown surface, i.e., the gap spacing, may be accomplished by measuring the capacitance between the reference electrode and the surface to be measured. More sensitive measurements may be accomplished using laser diodes and interferometric methods, such as those used in atomic force microscopy. See, e.g., Sarid et al., "Compact Scanning-Force Microscope Using a Laser Diode," *Optics Lett.*, 13, 1057 (1989).

The electronic processing circuitry 42, as previously mentioned, performs the functions of providing a dc bucking voltage, ac signal detection, and finding a null in the ac signal as a function of the bucking voltage. A charge sensitive amplifier 46 coupled to the photocapacitor at the end of the probe 30 through a FET 44 is preferred. This is because the noise produced by available charge sensitive amplifiers may be as low as 100 electrons. The processing circuitry 42 also preferably includes easy to read displays that indicate the maximum ac signal amplitude, the dc bucking voltage at null, modulation frequency, probe to sample separation (gap spacing), sensor capacitance, and sensor to sample resistance. All of these parameters may be provided using the techniques and methods previously described and/or conventional techniques known in the art.

Figure 7A:
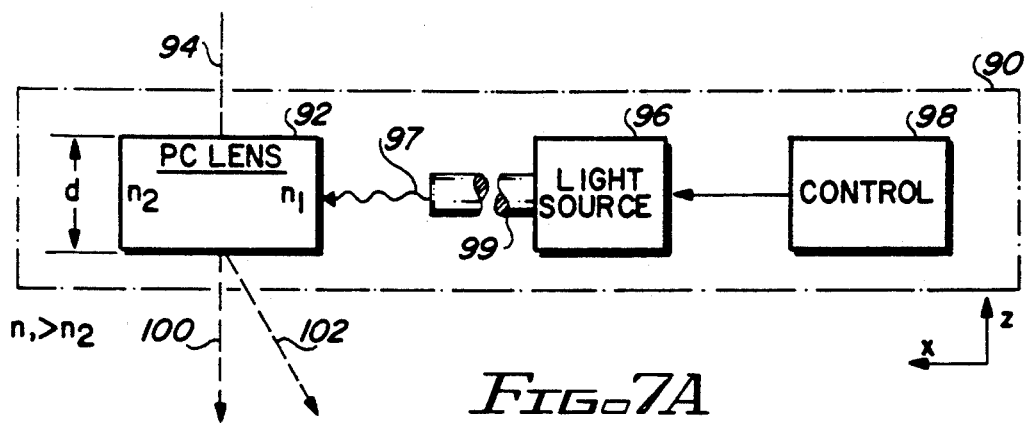
FIG. 7A is a schematic diagram of an optically modulated lens assembly.

Referring next to FIG. 7A, there is shown a schematic diagram of an optically modulated lens assembly made in accordance with another aspect of the present invention. The previously described photocapacitor show that the low frequency dielectric constant or permittivity of a photoconductor can be modulated or controlled by the absorption of visible light. The refractive index of a lens may be expressed as $$n = \epsilon^{\frac{1}{2}}. \tag{3b}$$

See, e.g., Jackson, *Classical Electrodynamics*, p. 217 (John Wiley & Sons 1962). Hence, modulation of $\epsilon$ provides modulation of n. Hence, by using a suitable photoconductor as a lens or mirror through which electromagnetic radiation, such as an IR beam, is directed, and by modulating the dielectric constant with visible light in the same or similar manner as described previously in connection with the photocapacitor, a tunable lens or mirror is realized that can steer or deflect the electromagnetic beam in a desired direction.

Hence, with reference to FIG. 7A, an optically tunable lens assembly 90 is made using a homogeneous body of photoconducting material 92 that is sufficiently transparent to an electromagnetic radiation beam or ray incident thereto. The beam 94 may be, for example, an IR beam. A suitable light source 96, controlled by a control circuit 98 directs light 97 of the appropriate frequency to the photoconductor 92. If desired, a fiber optic cable 99, or an array of fiber optic cables, may be used to control the delivery of the light 97 to the photoconductive lens (PC lens) 92. In general, in the absence of a modulating light beam 97, the beam 94 passes through the PC lens 92 in accordance with a first index of refraction, thereby exiting along a first beam path, e.g., the path indicated by the dotted line 100. In the presence of a modulating light beam 97, the index of the PC lens is altered, and the beam 94 passes though the PC lens 92 in accordance with a second index of refraction, thereby exiting along a different beam path, e.g., the path indicated by the dotted line 102. Thus, selective control of the modulating beam 97 causes the beam 94 to follow exit path 100 or 102, thus providing a means of non-mechanically steering the beam 94.

Preferably, the modulating beam 97 is obtained from a stationary two-dimensional array of LED's. In the x direction, the intensity of LED's light may be modulated by an appropriate method, such as by varying the duty cycle of the light, using partial light absorbers, or by some other means. The index of refraction (dielectric constant or permittivity) of the PC lens 92 is modulated as a function of the amount of light 97 absorbed therein. The phase velocity, v, and wavelength $\lambda$, for plane wave passing through the PC lens medium 92 may be expressed as:

$$v = c/n \tag{4}$$

and $\lambda = \lambda_{vac}/n$, (5)

where c is the speed of light, and n is the index of refraction. In general, for two points 1 and 2 of index $n_1$ and $n_2$, their wavelengths are related by $$n_1 \lambda_1 = n_2 \lambda_2. \tag{6}$$

Hence, for a graded lens 92 as shown in FIG. 7A of thickness d, the phase difference between the two points 1 and 2 of a plane wave exiting the lens is $$dp = 2\pi(d/\lambda_2 - d/\lambda_1) \tag{7}$$

$$= 2\pi(d/\lambda_{vac})(n_2 - n_1). \tag{8}$$

At low modulation frequencies, a modulation of $n_2 = 9$ and $n_1 = 3$ appears to be possible. Thus, for example, assuming this modulation to hold, in the IR frequency range, and assuming a lens having a thickness d of 10 microns, Equation (8) shows that a phase shift on the order of 36 rad may be achieved for $\lambda_{vac} = 10.6$ micron radiation.

Scanning of the IR (or other electromagnetic) beam 94 may advantageously be realized by ramping the light source 96. The ultimate modulation rate for the PC lens 92 is limited by the free carrier recombination time. As recombination times faster than a microsecond exist for some photoconductive materials, modulation rates on the order of at least a MHz are possible.

Figure 7B:
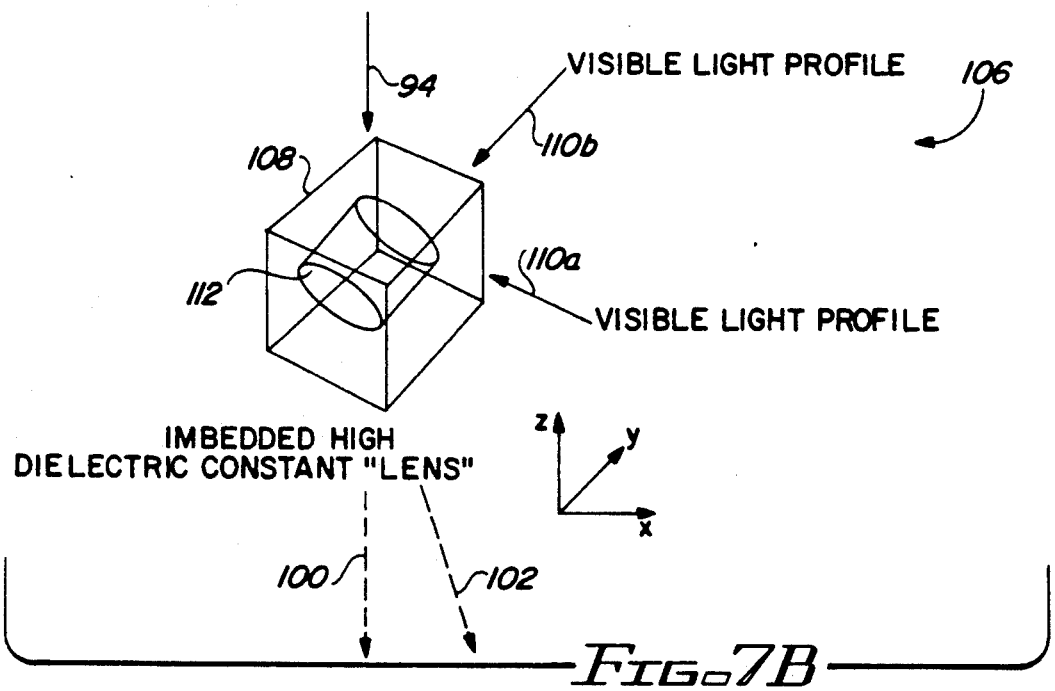
FIG. 7B is a schematic diagram of a lens assembly made from a photoconductor modulated by a light beam having an intensity profile varying in two directions.

Referring next to FIG. 7B, a schematic diagram is illustrated of a lens assembly 106 made from a photoconductor block 108 modulated by one or two light beams 110a and 110b, each having an intensity profile varying in two directions. Light beam 110a propagates in the $-x$ direction and has an intensity profile varying in the y and z directions. Light beam 110b propagates in the $-y$ direction and has an intensity profile varying in the x and z directions. This configuration advantageously provides an "imbedded" volume 112 of higher dielectric constant material within the photoconducting block 108. That is, as explained above, the visible light beam 110a has an intensity profile that varies in two directions, perpendicular to its direction of propagation. Such visible light "sculpts" a cylindrical region of higher permittivity within the block 108. Advantageously, the second visible beam 110b, orthogonal to the first, allows more complex shapes to be created inside the block. In this way, it possible to create, e.g., IR lenses within the block 108 which can be turned on and off, and/or rotated or translated within the block. Such non-mechanical creation and movement of lenses provides a great deal of flexibility in the design and operation of a beam steering system.

Figure 8:
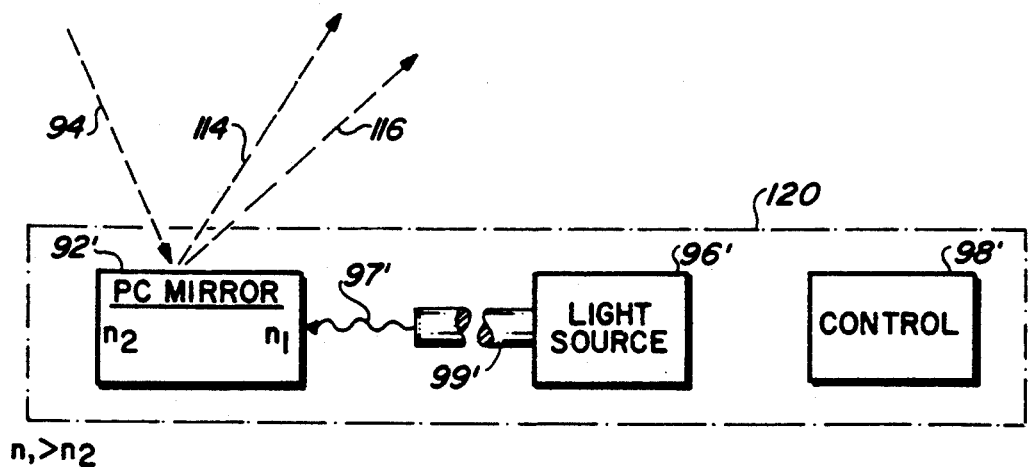
FIG. 8 is a schematic diagram of an optically modulated mirror assembly.

FIG. 8 shows a schematic diagram of an optically modulated mirror assembly 120 that is realized in a manner similar to the lens assembly 90 of FIG. 7A, except that at least a portion of the incident beam 94 of electromagnetic radiation reflects from the block of photoconductor material 92'. Thus, the photoconductor material 92' may be referred to as a photoconductive (PC) mirror 92'. Visible light 97' from a suitable light source 96', such as an LED array, provides a means of modulating the index, n, of the PC mirror 92'. The source of light 96' is controlled by a suitable control circuit 98', and a fiber optical cable 99', or an array of fiber optic cables, may be used as needed and desired to better direct the light 97' to the PC mirror 92'.

The operation of the PC mirror 92' of FIG. 8 is similar to the operation of the PC lens 92 of FIG. 7A. That is, in the absence of a modulating light beam 97', the beam 94' reflects from the surface of the PC mirror 92' in accordance with a first index, thereby traveling along a first beam path, e.g., the path indicated by the dotted line 114. In the presence of a modulating light beam 97', the index of the PC mirror 92' is altered, and the beam 94 reflects from the surface of the PC mirror 92' in accordance with a second index, thereby traveling along a different beam path, e.g., the path indicated by the dotted line 116. Thus, selective control of the modulating beam 97' causes the beam 94 to follow path 114 or 116, thus providing a means of non-mechanically steering the beam 94.

As known to those skilled in the art, reflection from a material, such as the photoconductor block 92', may occur from a layer or plane within the medium (some distance beneath the surface), as well as from the external surface of the medium. As the refractive index of the material affects the passage of the radiation into the medium both before and after such reflection, the refractive index of the material influences the ultimate angle of reflection.

For a plane wave in vacuum normally incident on a surface of index of refraction n, the reflected intensity ratio R may be expressed by the Fresnel relation:

$$R = (n-1)^2/(n+1)^2. \qquad (9)$$

For most photoconducting materials that will likely be used as the PC mirror 92', e.g., CdS, CdSe, CdTe, HgCdTe, Ge, Si, GaAs, PbS, PbSe, InP, ZnS, ZnSe, (which same materials may also be used as the PC lens 92), the value of R from or near the surface or such materials should vary from 25% to as much as 70%. Therefore, a strong reflected beam or wave will be present. The penetration of the reflected beam into the photoconductor depends on the local free carrier concentration. The amount of penetration is adjustable. This is because there will be a phase shift induced locally over that of an ideal interface, with the magnitude of this phase shift being tunable.

In a preferred embodiment, the phase of the reflected beam is varied laterally by varying the intensity of visible light 97' laterally. As described above, varying the intensity of the visible light 97' modulates the permittivity and hence the refractive index. If desired, the depth dependence to the refractive index can be optimized by introducing internal discontinuities, either by varying the visible light intensity or having highly reflective internal surfaces.

As described above, it is thus seen that the present invention provides simple-to-construct and easy-to-use instrumentation apparatus and methods utilizing light modulated photoconductors. Such photoconductors exhibit a variable permittivity or dielectric constant that varies as a function of modulated light directed to the photoconductor. Advantageously, this varying dielectric constant permits heretofore difficult and cumbersome measurements and techniques, such as measuring the CPD of a material, to be readily and accurately performed.

As further described above, it is seen that one embodiment of the invention provides a light modulated capacitor, or "photocapacitor". Such photocapacitor may readily be incorporated into instrumentation apparatus and methods used to, e.g., measure the work function of a material, or read an IR detector array. Advantageously, the provided photocapacitor is non-mechanical (has no moving mechanical parts) and can be modulated at high frequencies without creating spurious electrical signals. Hence, it is ideally suited for use in a non-mechanical Kelvin probe, a non-contacting charge readout, a non-contacting voltmeter, or an electric field sensor.

As also described above, it is seen that another embodiment of the present invention provides an optically modulated photoconductor that may be used as a non-mechanical lens or mirror. Such lens or mirror advantageously provides a non-mechanical mechanism for selectively steering or guiding a beam of electromagnetic radiation that passes therethrough, or reflects therefrom.

While the invention described herein has been described with reference to particular embodiments and applications thereof, numerous variations and modifications could be made thereto by those skilled in the art without departing from the spirit and scope of the invention as claimed.

APPENDIX A

Work Function

The work function of a material is defined as the difference between the electrochemical potential $\bar{\mu}$ inside the conductor and the electrostatic potential of an electron just outside the body far enough away that the image potential is negligible [Herring and Nichols 49, we draw heavily on this reference in this section].

The electrochemical potential $\bar{\mu}$ is defined as $$\bar{\mu} = \partial F/\partial n)_{T,V} = \partial G/\partial n)_{T,P} = \partial U/\partial n)_{S,V} = \partial H/\partial n)_{S,P} \qquad 1)$$

where F and G are the Helmholtz and Gibbs free energies, U is the internal energy, H the heat content, and n the number of electrons. If the electrostatic potential $\phi$ is changed by $\Delta\phi$ then $\bar{\mu}$ is changed by $-e\Delta\phi$, where $-e$ is the charge on an electron. So the electrochemical potential depends on external factors such as $\phi$. However, the chemical potential $\mu$, called the Fermi energy in an electron gas and defined by $$\pi = \mu - e\phi \qquad 2)$$

is independent of the electrostatic potential, $\phi$. The electrostatic potential inside the body is usually defined as a space average of the microscopic electrostatic potential over a volume containing many atoms but still macroscopically small, as indicated in Figure 1.

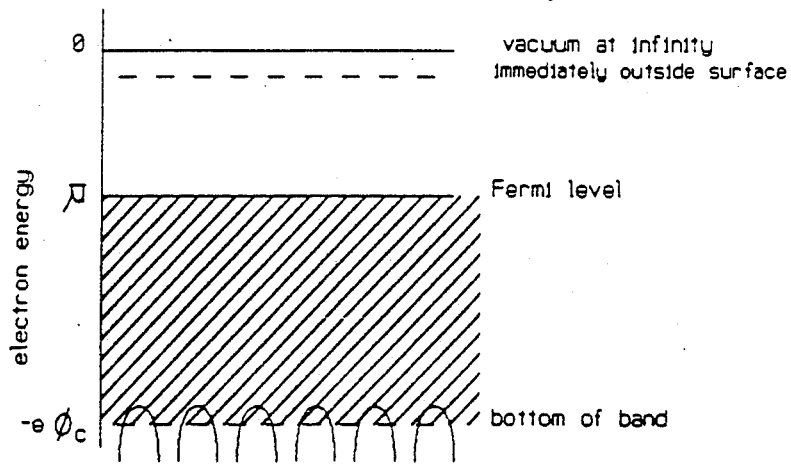

Figure 1. Energy level schematic. $\pi$ and $-e\phi_c$ are both negative quantities if the zero of energy is for an electron at rest at infinity.

If the energy of an electron, $\epsilon$, is measured with zero being at rest at infinity as shown in Figure 1, then the Fermi factor $F(\epsilon)$ giving the probability of occupancy is $$F(\epsilon) = 1/[e^{(\epsilon-\mu)/kT}+1] \qquad 3)$$

On the other hand, if the energy of an electron $\epsilon'$ is measured from a zero with local mean electrostatic potential $-e\phi_c$, then $$1/[e^{(\epsilon-\mu)/kT}+1] = 1/[e^{(\epsilon-\mu+e\phi_c)/kT}+1] = 1/[e^{(\epsilon+e\phi_c-\mu)/kT}+1] = 1/[e^{(\epsilon'-\mu)/kT}+1] \qquad 4)$$

This is the more usual description. It illustrates the utility of the chemical potential when measuring energies from the bottom of a band in which case the energy of an electron is just its kinetic energy. In either case, the probability that at state of given energy will be occupied depends only on the separation of the state in energy from the Fermi level, as shown in Figure 2.

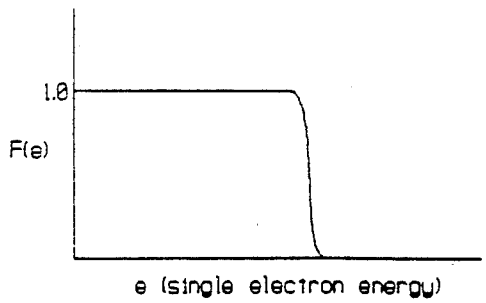

Figure 2. Fermi function giving the probability that a state of energy $\epsilon$ will be occupied.

The work function, $e\varphi$, is defined as the difference between the electrochemical potential $\bar{\mu}$ inside the conductor, and the electrostatic potential $-e\phi_a$ in the vacuum just outside the conductor.

$$e\varphi = -e\phi_a - \bar{\mu} \qquad\qquad 5)$$

$$\varphi = -\phi_a - \bar{\mu}/e \qquad\qquad 6)$$

By "just outside" is meant far enough into the vacuum from the surface that the image potential is negligible, but close enough that the electron is still within the patch fields of the conductor. In this case a small difference in work function between different crystal faces is observed. In practical terms, elementary calculation indicates that 100 Å from the surface is adequate for most applications.

Alternatively, in terms of the chemical potential $\mu$, Equation 6 becomes $$\varphi = -\phi_a - (\mu - e\phi_c)/e \qquad\qquad 7)$$

$$= \phi_c - \phi_a - \mu/e \qquad\qquad 8)$$

The term $\phi_c - \phi_a$ represents a potential difference between the inside and outside of the conductor, as shown in Figure 3.

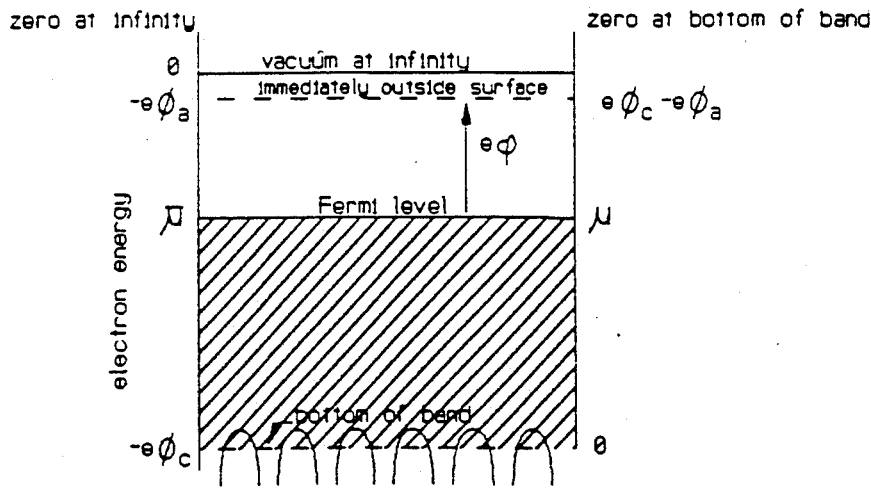

Figure 3. Energy level schematic showing the relationship among the different quantities when the zero of energy is taken at the bottom of the band.

The strong electric fields producing the potential difference $\phi_c - \phi_a$ are present at the surface. They are formally equivalent to a strong surface dipole layer and are referred to as such. Any change in the surface dipole moment per unit area, $\Delta$, changes $\phi_c - \phi_a$ by $\Delta$ [Herring and Nichols 49]. Although $\mu$ is a volume quantity only, $\phi_c - \phi_a$ is found to vary from crystal face to crystal face through observed variations in $\varphi$. A consequence of the variation of surface dipole moment with crystal face is that there are electric fields for macroscopic distances outside a conductor, called the patch fields. It is these fields which produce the variation in $\phi_a$ outside the conductor.

Contact Potential Difference

For two dissimilar bodies 1 and 2, Equation 5 reads $$e\varphi_1 = -e\phi_{a1} - \mu_1 \qquad 9)$$

$$e\varphi_2 = -e\varphi_{a2} - \mu_2 \qquad 10)$$

In general, there is an electrostatic potential difference between two points outside the bodies given by $e\phi_{a1} - e\phi_{a2}$.

When 1 and 2 are brought into contact, a small amount of charge flows from one to the other in order to establish equilibrium:

$$\mu_1 = \mu_2 \qquad 11)$$

In equilibrium then, $$\phi_{a1} - \phi_{a2} = \varphi_2 - \varphi_1 = \Delta\varphi \qquad 12)$$

This is the contact potential difference (CPD). There is a difference in electrostatic potential outside two dissimilar conductors in contact. It is illustrated by Figures 4a and 4b, and Figure 5.

It is useful to consider a geometry more experimentally favorable such as a capacitor formed by dissimilar materials, as indicated in Figure 4b.

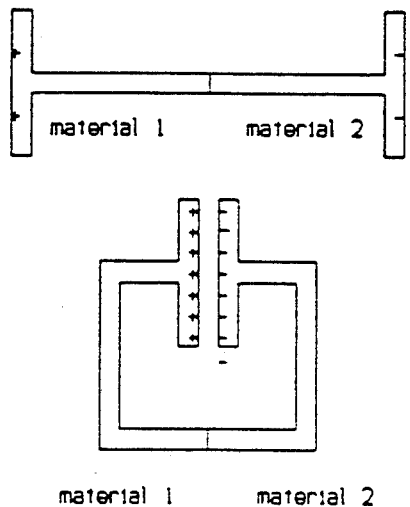

Figure 4. a) Two conductors in contact. b) Two conductors in contact in the more experimentally favorable geometry of a capacitor.

The effect of contact on the energy levels can be shown as:

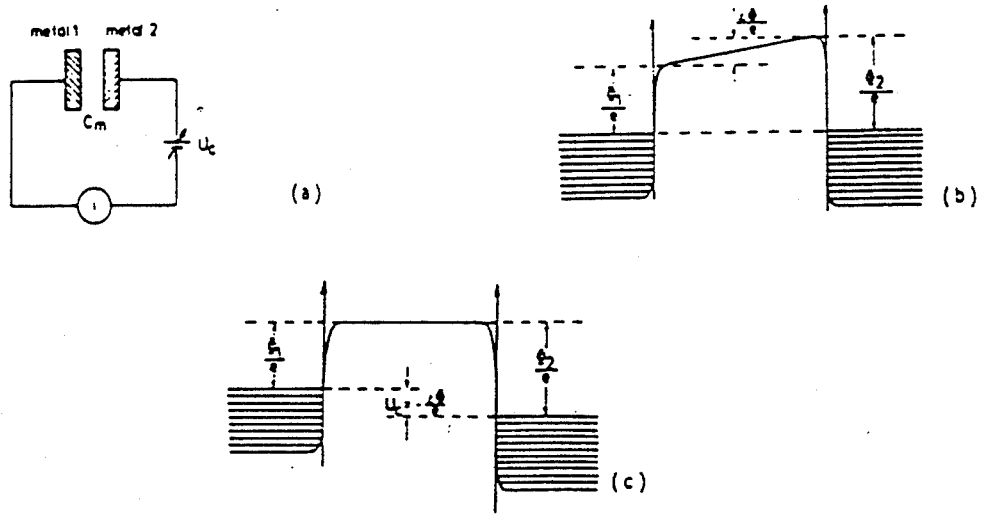

Fig. 3.13. a) Basic principles of the vibrating capacitor method:
$C_m$: experimental capacitor with variable capacitance
$U_c$: variable voltage source for bucking voltage
$i^c$: ac current detector
b) Potential variation between the condenser plates when $U_c = 0$
c) Potential variation between the condenser plates when $U_c = -\Delta\zeta/e$ Figure 5. From Holzl and Schulte 79.

The capacity C of the actual configuration of the two conductors in Figure 5 determines how much charge is transferred to produce equilibrium:

$$Q = C \Delta\varphi \qquad 13)$$

There is an electric field present in the space between the capacitor plates which is governed by the potential difference $\phi_{a1} - \phi_{a2}$ and the separation of the plates. The greater the capacity, the more charge Q that must be transferred. The CPD between two materials is fixed but from Equation 13 it is seen that a time variation in C will produce a current between 1 and 2 given by:

$$dQ/dt = \Delta\varphi \, dC/dt \qquad \qquad 14)$$

For a capacitance forced to vary as $$C = C_0 + C_1 \, e^{j\omega t} \qquad \qquad 15)$$

then $$i = \Delta\varphi \; j\omega \, C_1 \, e^{j\omega t} \qquad \qquad 16)$$

and if there is another source of voltage $V_B$ in the circuit as shown in Figure 5 then $$i = (\Delta\varphi - V_B) \, j\omega \, C_1 \, e^{j\omega t} \qquad \qquad 17)$$

From Equation 17, when $$V_B = \Delta\varphi \qquad \qquad 18)$$

then $$i = 0 \qquad \qquad 19)$$

That an ac modulation of C allows a dc voltage $V_B$ to be tuned for a null in the ac current i forms the basis of the vibrating capacitor method of work function measurement. Generally, a mechanical variation of the capacitor plate spacing of order 10% has been employed to modulate C.

Typical equivalent circuits used to measure the CPD are similar to that used by Craig and Radeka [70] shown in Figure 6.

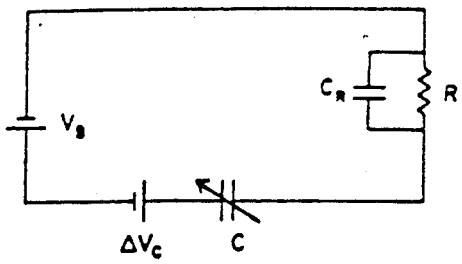

FIG. 2. Equivalent circuit for the ac Kelvin method. The detected signal is the voltage $V_R$ appearing across R $[C = C_0 (1 + \epsilon \cos\omega t)]$.

Figure 6. Equivalent circuit to measure CPD. [Craig and Radeka 70].

In Figure 6, C is the mechanically varied capacitor, $\Delta V_c$ is the CPD, $V_b$ the bucking voltage, R a series resistor across which the ac signal is developed, and $C_R$ the input capacitance of the amplifier and leads to the vibrating capacitor.

Generally, mechanical factors limit the frequency of vibration of capacitors to a few hundred Hz. In addition, with mechanical vibration, stray capacitance to surrounding components produces a time varying signal which is indistinguishable from the signal of interest. It would be convenient if higher frequency operation were possible. These considerations led us to examine non-mechanical methods of varying C, as described below.

REFERENCES

Craig, P.P. and V. Radeka, "Stress Dependence of Contact Potential Difference: The ac Kelvin Method," Rev. Sci. Instrum. 41, 258 (1970).

Heppenheimer, T.A., "Superconducting. The New Billion Dollar Business." High Technology, July 1987, p. 12.

Herring, C. and M.H. Nichols, "Thermionic Emission," Rev. Mod. Phys. 21, 185 (1949).

Holzl, J. and F.K. Schulte, in Solid Surface Physics, edited by G. Hohler, Vol. 85 of "Springer Tracts in Modern Physics (Springer, Berlin 1979) pp. 1-150.

APPENDIX B

IV. CONTACT POTENTIAL DIFFERENCE MEASUREMENT

The magnitude of the variation of capacitance with light described above is encouraging for $\Delta\varphi$ measurement. Therefore a circuit was assembled along the lines shown in Figure 6, with the mechanical variation of capacitance being replaced by light modulation of the photoconductor. Figure 13 shows the circuit layout.

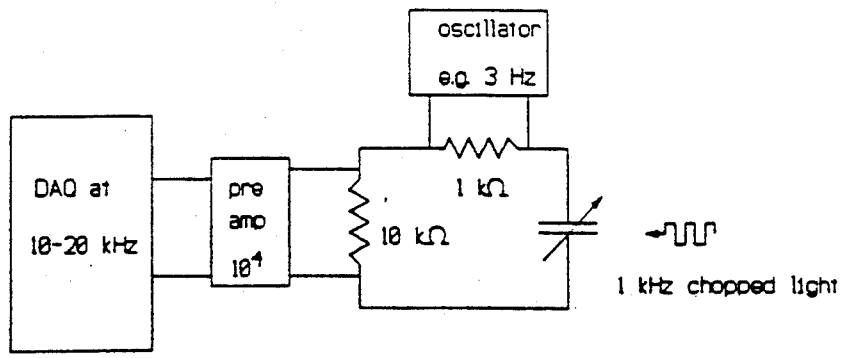

Figure 13. Circuit for CPD measurement using light modulated capacitance.

The fiber optic bundle light source was used with a mechanical chopper with a chopping frequency from 6 Hz to 4 kHz. Most measurements were done at 1 kHz. For convenience with the present set up the chopping wheel was positioned between the end of the fiber optic and the film structure. Chopped light was reflected from a mirror, passed through the substrate into the photoconductor. The photoconductor is also partially transparent.

The bucking voltage was supplied by a low frequency oscillator from 1 to 10 Hz across a 1 k$\Omega$ resistor. Triangular waveforms (an alternating ramp voltage) and a sine wave were used. The oscillator had an adjustable dc offset which was adjusted as close to zero as possible. In other measurements an adjustable battery powered dc bucking voltage was used.

The ac detection signal appears across the 10 k$\Omega$ resistor. Originally we used phase sensitive lockin detection at the chopping frequency to measure the ac signal but it turned out that there was a large signal. Because we wanted a faster circuit response and also for convenience, the lockin was replaced with a signal digitizer and data stored for later analysis.

Several samples were tested. The one described in Tables 1 and 2 was one of the best in terms of dark resistance, low noise, and photo response. It comprises an ITO reference electrode and an evaporated Au counter electrode. This sample is discussed below.

A triangular waveform of magnitude $\pm 1$ V was applied as a bucking voltage. The resultant signal across the 10 k$\Omega$ resistor was amplified by $10^4$ with an ac coupled pre-amp. The amplified signal was digitized at 10 to 20 kHz sampling and stored. Light was chopped at 1 kHz and we see a signal at 1 kHz on the 10 k$\Omega$ input resistor. Digitizing at this rate gives 10-20 points per cycle. The bucking voltage was simultaneously digitized at the same rate. Figure 14 shows the two channels of stored data.

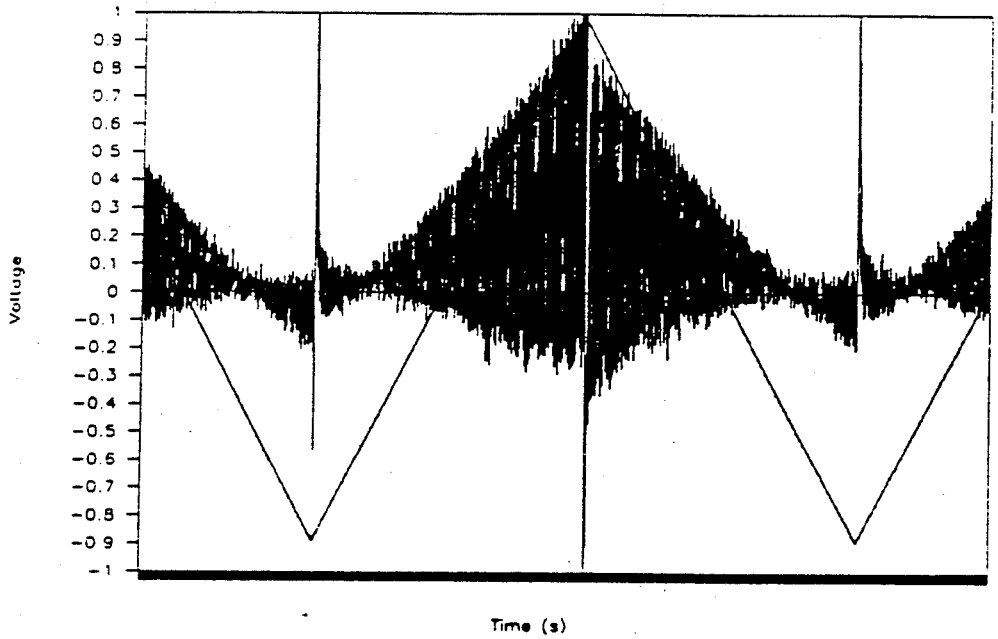

Figure 14. A 0.5 sec record of two simultaneous traces, each digitized at 10 kHz. Light chopped at 1 kHz was used. The triangular waveform channel has gain of 1. The high frequency trace, the signal channel, was amplified by $10^4$.

The two traces are clearly different in Figure 14. Over the 0.5 second time interval shown the 1 kHz signal appears as a band. Ignoring the spikes for the moment, it is seen that the ac signal amplitude shrinks to a minimum each time the ramped "dc" bucking signal goes through about -0.5 V. This is the behavior expected for a contact potential difference of -0.5 V when the capacitance is modulated at 1 kHz. We are investigating alternative explanations, such as chopped photovoltaic effects, but believe it to be the CPD.

The spikes on the signal channel in Figure 14 are obviously connected with the discontinuity in the rate of change of the triangular wave bucking voltage. Connected with the spikes appearing on the ac channel is a shift in dc level which decays away; evidently some dc gets through the ac coupling in the preamp.

A sinewave bucking voltage is intrinsically smoother than the triangular wave form and should therefore suppress the spikes. Figure 15 shows a 3 Hz sinewave bucking voltage.

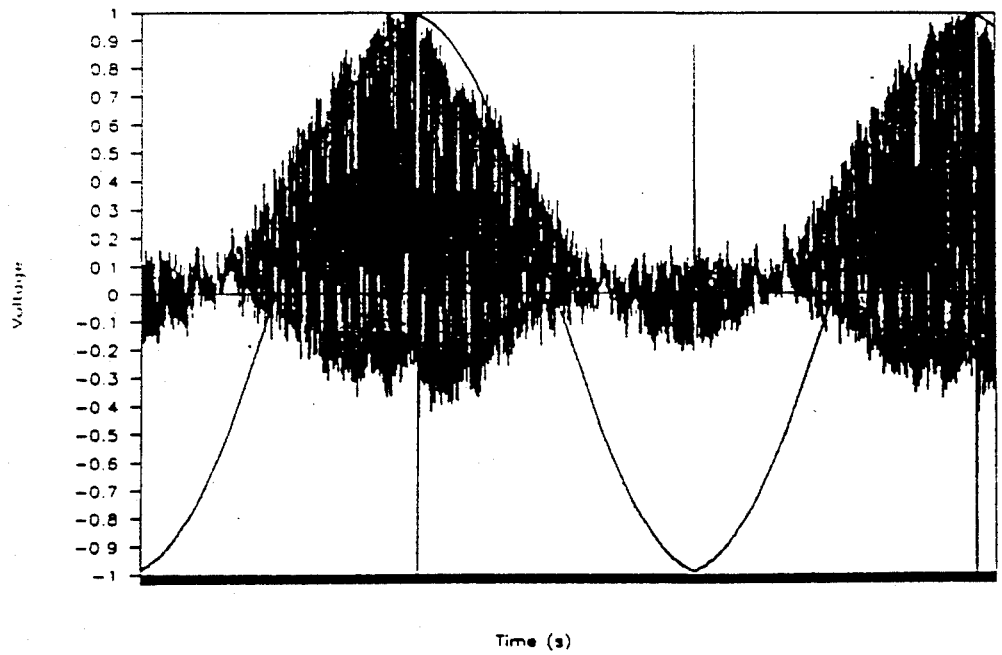

Figure 15. A 0.5 sec record of two simultaneous traces, each digitized at 10 kHz. Light chopped at 1 kHz was used. The sinewave channel has gain of 1. The high frequency trace was amplified by $10^4$.

The spikes are still present in Figure 15 but reduced some in magnitude. Examination of the sinewave shows that it is not smooth at the positive and negative peaks. The ac signal again shows a minimum in magnitude as the bucking voltage goes through about -0.5 V.

Figures 16 and 17 show data taken with a 1 Hz bucking voltage.

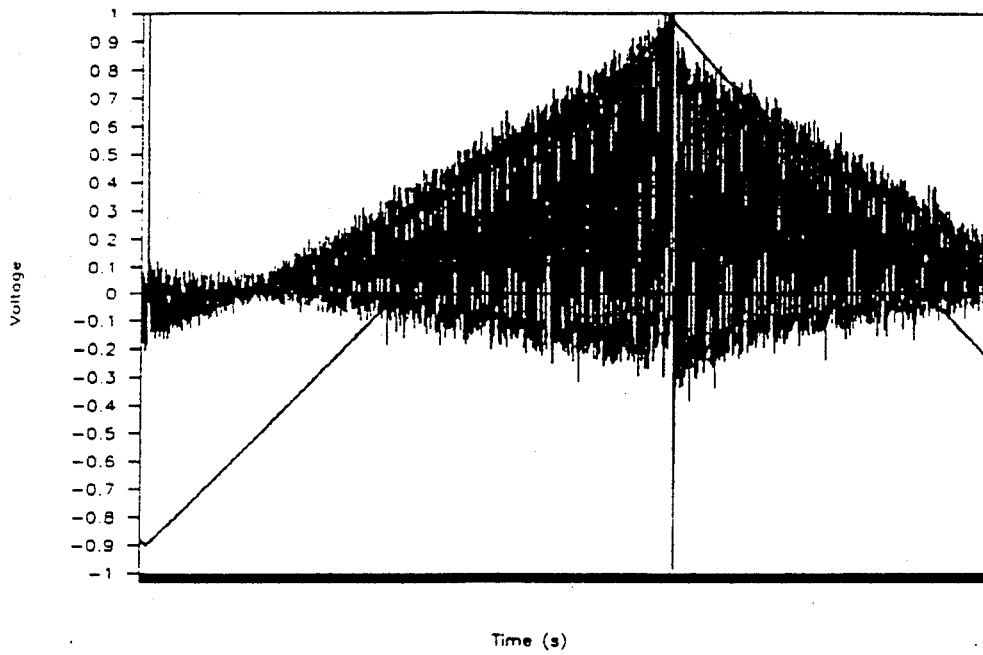

Figure 16. A 0.82 sec record of two simultaneous traces, each digitized at 10 kHz. Light was chopped at 1 kHz. The channel displaying the 1 Hz triangular waveform has gain of 1. The high frequency trace was amplified by $10^4$.

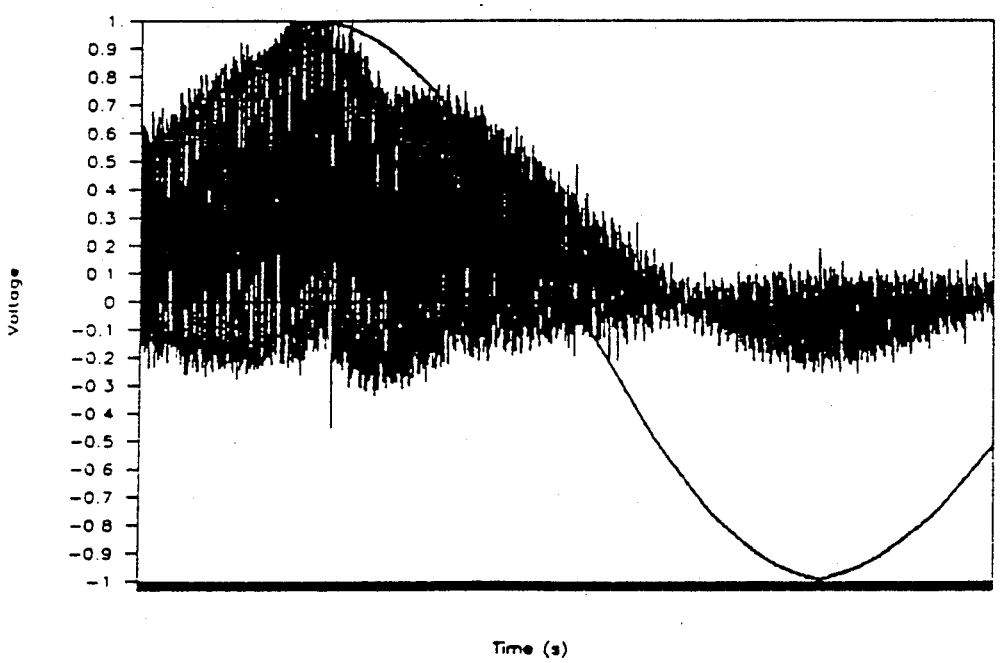

Figure 17. A 0.82 sec record of two simultaneous traces, each digitized at 10 kHz. Light was chopped at 1 kHz. The channel displaying the 1 Hz sinewave has gain of 1. The high frequency trace was amplified by $10^4$.

As is obvious, Figure 16 is for a triangular wave and Figure 17 for a sinewave. Ac signal minima are seen for bucking voltages near -0.5 V for the triangular wave. The minimum for the sinewave appears to be about -0.6 V, but the noise level obscures the minimum without more data analysis.

Data were taken with bucking voltages ramped at 10 Hz but severe ringing or aliasing was observed so they are not reported yet. Data were also taken with larger excursions of the bucking voltage. When the voltage was larger, especially in the positive direction, the ac output became noisier, suggesting breakdown in the film structure. This would not be unexpected.

For analysis, a 3 Hz triangular waveform and signal digitized at 20 kHz is shown in Figure 18 and in Figures 19 and 20.

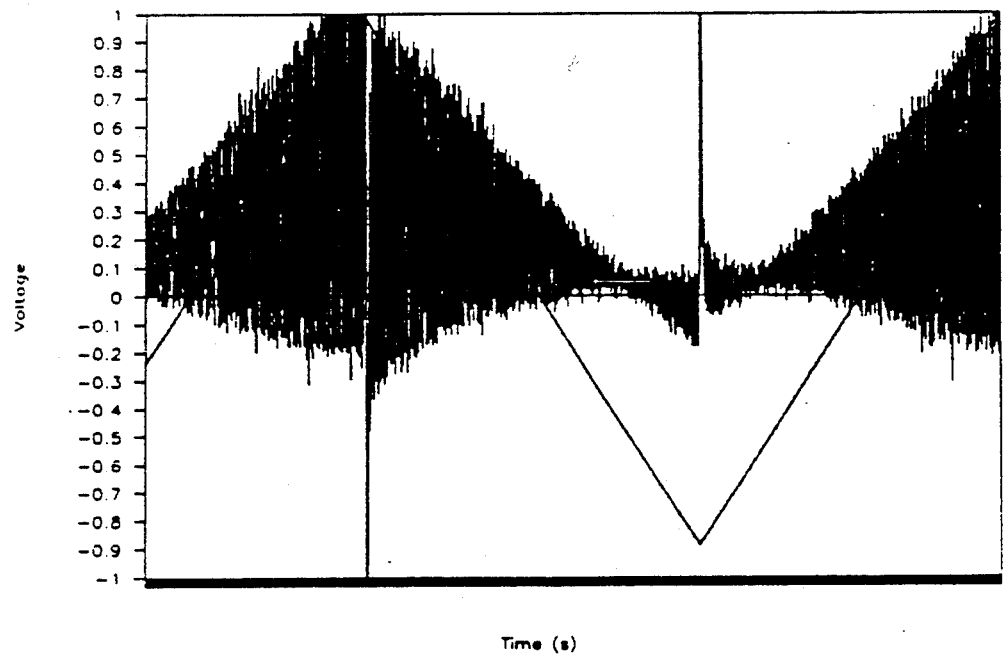

Figure 18. A 0.41 sec record of two simultaneous traces, each digitized at 20 kHz. Light chopped at 1 kHz was used. The triangular waveform channel has gain of 1. The high frequency trace, the signal channel, was amplified by $10^4$.

These data are consistent with Figure 14, taking into account the different record lengths. The actual ac signal over a portion of the run where the bucking voltage is far from null at about + 0.9 V is shown in Figure 19.

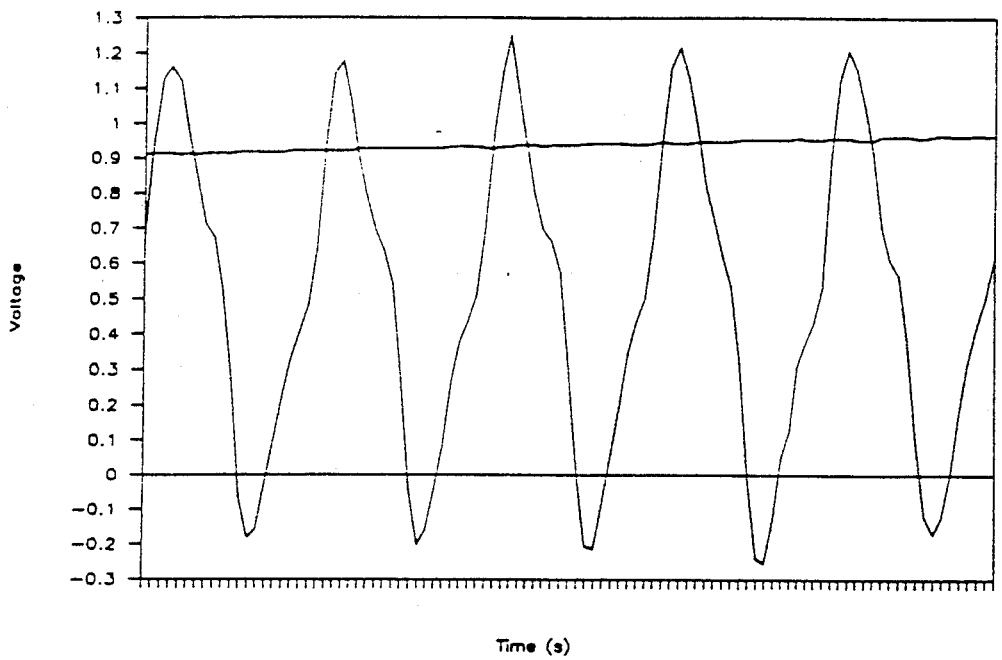

Figure 19. Data from Figure 18 shown with an expanded time axis. The "dc" bucking voltage is about +0.9 V. The ac signal has a 1 kHz repetition rate.

The coarseness of digitizing is evident in Figure 19, as is some noise. The bucking voltage over this restricted time interval is nearly constant at +0.9 V. The ac waveform is not sinusoidal, appearing somewhat more peaky. This is not unexpected inasmuch as the light output from the chopper is not sinusoidal either. It should be possible to either calculate or independently measure the light output of the chopper, but that has not been done yet.

Near -0.5 V bucking the magnitude of the ac signal drops considerably as can be seen in Figure 20.

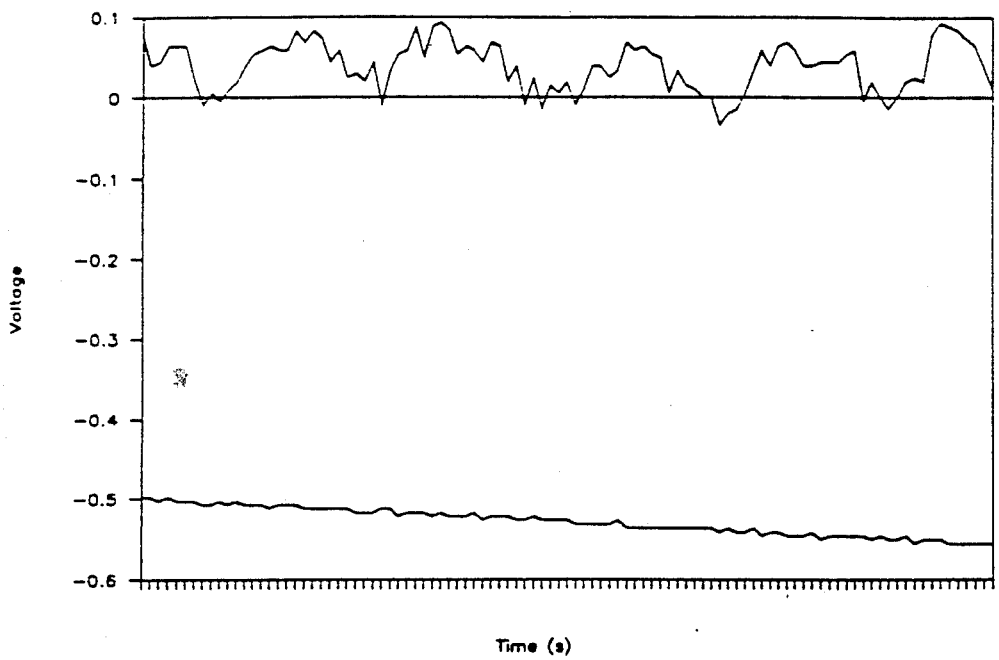

Figure 20. Data from Figure 18 shown with an expanded time axis. The "dc" bucking voltage is about -0.5 V. The ac signal has a 1 kHz repetition rate.

Here the voltage scale is expanded over that in the previous Figure 19. At this scale, noise is somewhat more evident. The seemingly random noise is about 4 $\mu$V referred to the input. Only elementary shielding and noise reduction measures were done at this point. It may also be the case that what appears as noise is higher Fourier components of signal.

In order to analyze the raw data shown in Figures 14-18 it is useful first smooth it and/or convert the ac signal to an rms magnitude. To this end we computed a moving 30 point standard deviation an the ac signal channel. Figure 21 shows these data for a 3 Hz triangular ramp bucking voltage in Figure 18. The moving standard deviation greatly smooths the data and makes it easier to identify the minima in ac signal. Basically this procedure provides an output similar to that ac voltmeter.

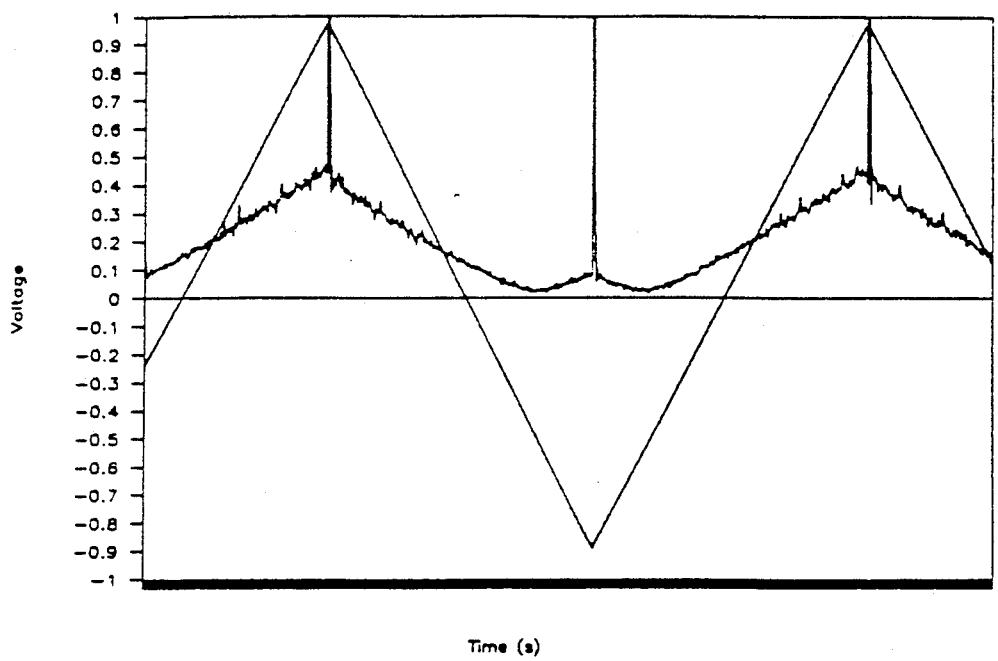

Figure 21. Moving standard deviation data for the signal channel of the 3 Hz triangular ramp bucking voltage in Figure 18.

Moving standard deviation data were also computed for a 1 Hz triangular waveform run and a 1 Hz sine waveform run as shown in Figures 22 and 23.

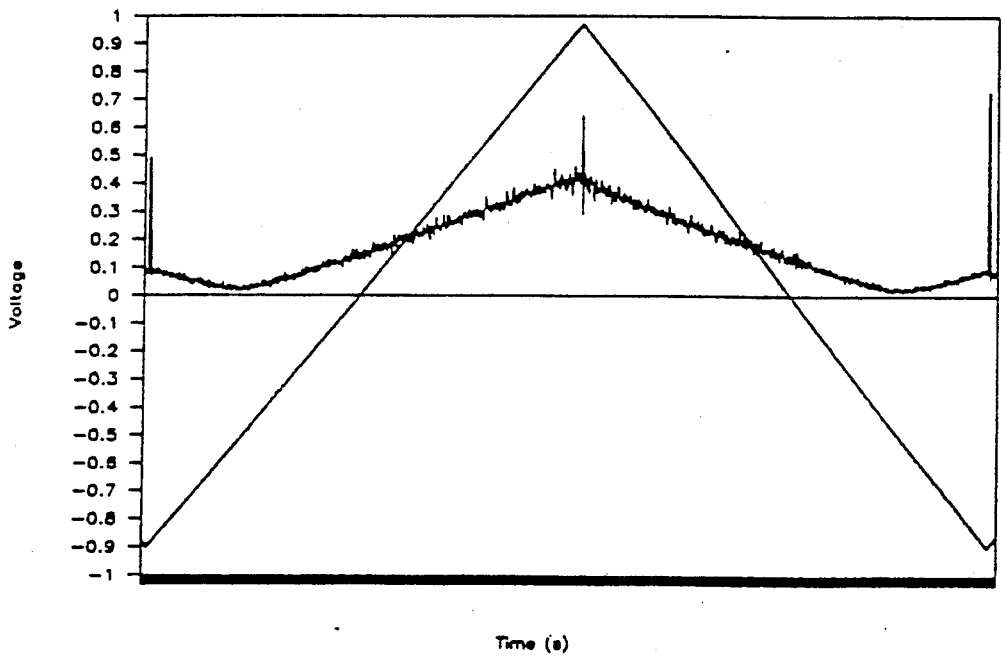

Figure 22. Moving standard deviation data for the signal channel of the 1 Hz triangular ramp bucking voltage in Figure 16.

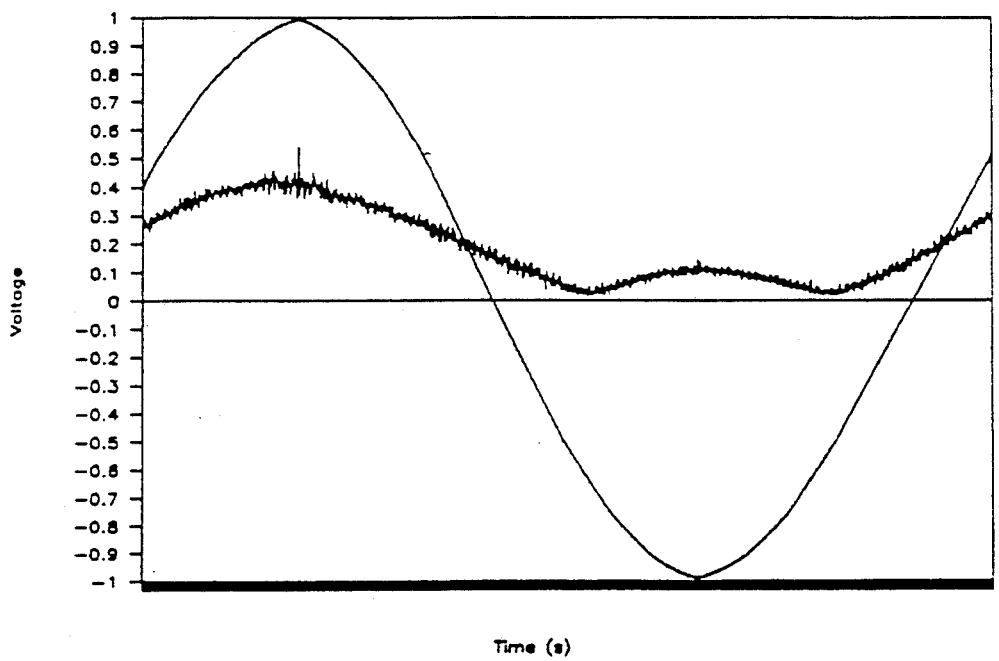

Figure 23. Moving standard deviation data for the signal channel of the 1 Hz sinewave bucking voltage in Figure 17.

These data show enhanced smoothing and generally good agreement with each other. The ac data for sinewave bucking voltage seem to show a hysteresis that is not present in the triangular wave data.

Finally, it is instructive to plot the ac data vs the bucking voltage. This was done for the data of Figure 14 and the results are shown in Figure 24.

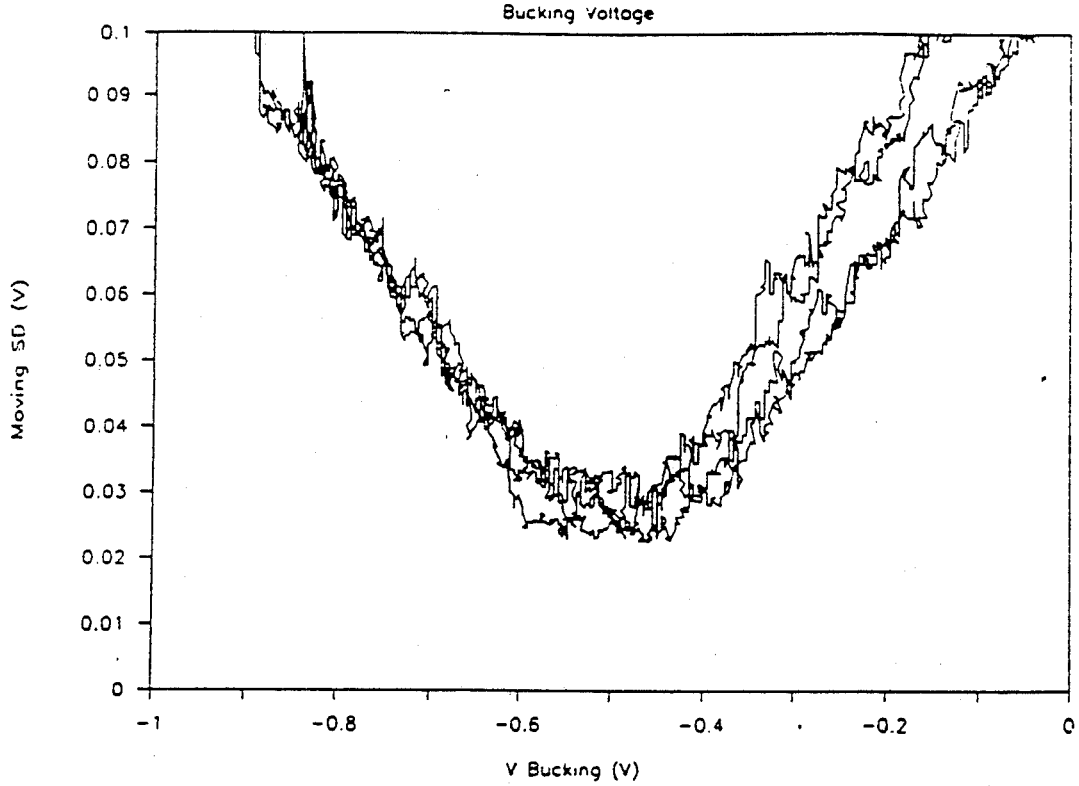

Figure 24. The rms magnitude (moving standard deviation) of the ac signal channel data vs the bucking voltage data.

The moving standard deviation is plotted on the y-axis vs the bucking voltage on the x-axis. The scale of the y-axis is quite expanded which magnifies the appearance of voltage fluctuations. It is seen that the ac data are a linear function of the deviation of the bucking voltage from null. This is expected from the simplest treatment of the CPD.

There are four traces coming into null from the left hand side and four from the right. The ones on the right fall on top of each other. On the right the two outgoing traces fall on top of each other as do the incoming, but there is a small difference between incoming and outgoing. This hysteresis is not understood yet, but is probably due to instrumental time constants.

Lastly, the y-axis data do not go to zero as would be expected in the perfect case. This is thought to be due to noise. It amounts to 3 $\mu$V rms referred to input.

What is claimed is:

1. Beam steering apparatus comprising:
a photoconductor having a band gap frequency, said photoconductor exhibiting a first permittivity when not exposed to light or when exposed to light of frequencies less than said band gap frequency, and a permittivity other than aid first permittivity when exposed to light of frequencies greater than said band gap frequency, said photoconductor being transparent to a beam of electromagnetic radiation of a frequency less than said band gap frequency, said transparent photoconductor exhibiting an index of refraction that varies as a function of the permittivity exhibited by said photoconductor;

light exposing means for selectively exposing said photoconductor to light having frequencies greater than said band gap frequency, whereby said photoconductor exhibits a permittivity other than said first permittivity when so exposed, said light exposing means further including means for exposing said photoconductor to light having an intensity profile that varies in tow directions, said light causing a volume to be created within said photoconductor that exhibits different permittivities than said first permittivity; and beam directing means for directing a beam of electromagnetic radiation toward said photoconductor, the amount of refraction or bending of said beam as it passes through said volume of said photoconductor being controlled by selectively exposing said photoconductor to light with said light exposing means.

2. Beam steering apparatus comprising:

a photoconductor having a band gap frequency, said photoconductor exhibiting a first permittivity when not exposed to light or when exposed to light of frequencies less than said band gap frequency, and a permittivity other than said first permittivity when exposed to light of frequencies greater than said band gap frequency, said photoconductor being reflective to a beam of electromagnetic radiation, said reflective photoconductor exhibiting an index of reflection that varies as a function of the permittivity exhibited by said photoconductor;

light exposing means for selectively exposing said photoconductor to light having frequencies greater than said band gap frequency, whereby said photoconductor exhibits a permittivity other than said first permittivity as a function of the amount of light absorbed in said photoconductor, whereby the photoconductor exhibits a range of permittivities as a function of the amount of light absorbed; and beam directing means for directing a beam of electromagnetic radiation toward said photoconductor, the angle of reflection of said beam as it reflects from said photoconductor being controlled by selectively exposing said photoconductor to light with said light exposing means so that a prescribed amount of light is absorbed in said photoconductor.

3. A method of optically steering an electromagnetic beam, said method comprising the steps of:

(a) directing said electromagnetic beam through a photoconductor substantially transparent to said electromagnetic beam said photoconductor having a band gap frequency, said electromagnetic beam having a frequency less than said band gap frequency, said photoconductor exhibiting a first permittivity when not exposed to light or when exposed to light of frequencies less than said band gap frequency, and a permittivity other than said first permittivity when exposed to light of frequencies greater than aid band gap frequency, said photoconductor further exhibiting an index of refraction that varies as a function of the permittivity of said photoconductor; and (b) optically changing the index of refraction of said photoconductor by selectively exposing said photoconductor to light having frequencies greater than said band gap frequency, said light having an intensity profile that varies in two directions, said light causing a volume to be created within said photoconductor that exhibits different permittivities than said first permittivity when so exposed, thereby altering the index of refraction of said photoconductor within said volume, thereby altering the amount said electromagnetic beam is refracted as it passes through said volume of said photoconductor.

4. A method of optically steering an electromagnetic beam, said method comprising the steps of:

(a) directing said electromagnetic beam to a photoconductor reflective of said electromagnetic beam, said photoconductor having a band gap frequency, said photoconductor exhibiting a first permittivity when not exposed to light or when exposed to light of frequencies less than said band gap frequency, and a permittivity other than said first permittivity when exposed to light of frequencies greater than said band gap frequency, said photoconductor further exhibiting an index of refraction that varies as a function of the permittivity of said photoconductor; and (b) optically changing the index of refraction of said photoconductor by selectively exposing said photoconductor to light having frequencies greater than said band gap frequency, said photoconductor exhibiting a permittivity other than said first permittivity as a function of the amount of light absorbed in said photoconductor, thereby altering the index of refraction of aid photoconductor as a function of the amount of ligh; absorbed, thereby controlling the angle that said electromagnetic beam is reflected from said photoconductor by controlling the intensity of the light to which said photoconductor is exposed.

5. The beam steering apparatus as set forth in claim 1 wherein said light exposing means includes first and second light beams, the second light beam being orthogonal to the first light beam, each of said first and second light beams having an intensity profile that varies in two directions, whereby the volume created by the intersection of said first and second beams within said photoconductor has an intensity profile that varies in up to three directions as controlled by the intensity profile of said first and second beam.

6. The beam steering apparatus as set forth in claim 5 wherein said volume within said photoconductor assumes a prescribed shape and orientation as controlled by the intensity profiles of said first and second beams.

7. The beam steering apparatus as set forth in claim 6 wherein aid volume within said photoconductor is turned on and off as controlled by the intensity profiles of said first and second beams.

8. The method as set forth in claim 3 wherein step (b) includes selectively exposing said photoconductor to first and second beams of light, each of said first and second beams of light having an intensity profile that varies in two directions, said volume being created at the intersection of said first and second beams within said photoconductor.

9. The method as set forth in claim 8 wherein said first beam of light is orthogonal to said second beam of light, and wherein step (b) further includes controlling the intensity profile of said first and second beams of light so as to control the shape and orientation of said volume within said photoconductor.

10. The method as set forth in claim 9 wherein step (b) includes controlling the intensity profile of said first and second beams of light so as to rotate said volume within said photoconductor.

11. The method as set forth in claim 9 wherein step (b) includes controlling the intensity profile of said first and second beams of light so as to translate said volume within said photoconductor.

* * * * *